US010926446B1

(12) United States Patent
Ouderkirk et al.

(10) Patent No.: US 10,926,446 B1
(45) Date of Patent: Feb. 23, 2021

(54) METHODS AND SYSTEMS FOR FABRICATING LAYERED ELECTROACTIVE MATERIALS

(71) Applicant: Facebook Technologies, LLC, Menlo Park, CA (US)

(72) Inventors: Andrew John Ouderkirk, Redmond, WA (US); Christopher Yuan Ting Liao, Seattle, WA (US); Katherine Marie Smyth, Seattle, WA (US); Thomas John Farrell Wallin, Redmond, WA (US); Jack Lindsay, Seattle, WA (US); Austin Lane, Bellevue, WA (US); Tanya Malhotra, Redmond, WA (US); Kenneth Diest, Kirkland, WA (US); Yigit Menguc, Kirkland, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 118 days.

(21) Appl. No.: 16/224,836

(22) Filed: Dec. 19, 2018

Related U.S. Application Data

(60) Provisional application No. 62/777,789, filed on Dec. 11, 2018.

(51) Int. Cl.
*B32B 3/12* (2006.01)
*B29C 48/07* (2019.01)
*B29C 48/30* (2019.01)
*B29C 48/35* (2019.01)
*G02B 27/01* (2006.01)

(52) U.S. Cl.
CPC ............ *B29C 48/07* (2019.02); *B29C 48/301* (2019.02); *B29C 48/304* (2019.02); *B29C 48/35* (2019.02); *G02B 27/0172* (2013.01)

(58) Field of Classification Search
CPC ....... B29C 48/07; B29C 48/301; B29C 48/35; B29C 48/304; G02B 27/0172
USPC .................................................... 156/244.11
See application file for complete search history.

(56) References Cited

U.S. PATENT DOCUMENTS

| | | | | | |
|---|---|---|---|---|---|
| 4,170,281 | A | * | 10/1979 | Lapeyre ................. | B65G 15/42 198/844.2 |
| 5,045,264 | A | * | 9/1991 | Kirksey ................. | B29C 48/30 264/173.16 |
| 5,458,834 | A | * | 10/1995 | Faber ...................... | B28B 3/269 264/109 |
| 5,516,474 | A | * | 5/1996 | Cloeren .................. | B29C 48/30 264/171.23 |

(Continued)

*Primary Examiner* — Philip C Tucker
*Assistant Examiner* — Vicki Wu
(74) *Attorney, Agent, or Firm* — FisherBroyles, LLP

(57) ABSTRACT

In various embodiments, an electrode precursor material may be flowed into a manifold extrusion die having first and second manifold inlet openings. Further, an electroactive polymer precursor material may be flowed into the manifold extrusion die via a third manifold inlet opening such that the electroactive polymer precursor material is layered between alternating layers of the electrode precursor material from the first and second manifold inlet openings. Moreover, the electrode precursor material and the electroactive polymer precursor material may be extruded through a manifold outlet opening of the manifold extrusion die. Various other methods, systems, apparatuses, and materials are also disclosed.

8 Claims, 12 Drawing Sheets

(56) References Cited

U.S. PATENT DOCUMENTS

| | | | | |
|---|---|---|---|---|
| 6,203,742 B1* | 3/2001 | Kegasawa | ............... | B29C 48/30 |
| | | | | 264/173.16 |
| 2005/0082147 A1* | 4/2005 | Mol | ....................... | B65G 15/42 |
| | | | | 198/834 |
| 2011/0014452 A1* | 1/2011 | Uto | ....................... | B29C 48/307 |
| | | | | 428/220 |
| 2012/0219752 A1* | 8/2012 | Bhopte | ..................... | F28F 7/02 |
| | | | | 428/117 |
| 2014/0342223 A1* | 11/2014 | Voelker | ................. | H01G 11/86 |
| | | | | 429/217 |
| 2016/0149204 A1* | 5/2016 | Schumann | ............. | H01M 4/13 |
| | | | | 429/209 |

* cited by examiner

METHODS AND SYSTEMS FOR FABRICATING LAYERED ELECTROACTIVE MATERIALS

CROSS REFERENCE TO RELATED APPLICATION

This application is a non-provisional utility application which claims the benefit of U.S. Provisional Application No. 62/777,789 filed 11 Dec. 2018, the disclosure of which is incorporated, in its entirety, by this reference.

BACKGROUND

Augmented reality (AR) and virtual reality (VR) eyewear devices or headsets may enable users to experience events, such as interacting with people in a computer-generated simulation of a three-dimensional world or viewing data superimposed on a real-world view. AR/VR eyewear devices and headsets may also be used for purposes other than recreation. For example, governments may use such devices for military training simulations, doctors may use such devices to practice surgery, and engineers may use such devices them as visualization aids.

AR/VR eyewear devices and headsets typically include some form of optical system or device, such as an optical lens assembly configured to focus or direct light from the device's display and/or the real world to the user's eyes. Thus, there is a need for improving such optical systems.

SUMMARY

As will be described in greater detail below, the instant disclosure describes layered electroactive materials, and associated systems and methods.

In various embodiments, a method is described. The method may include (i) flowing an electrode precursor material into a manifold extrusion die via first and second manifold inlet openings, (ii) flowing an electroactive polymer precursor material into the manifold extrusion die via a third manifold inlet opening such that the electroactive polymer precursor material may be layered between alternating layers of the electrode precursor material from the first and second manifold inlet openings, and (iii) extruding, through a manifold outlet opening of the manifold extrusion die, the electrode precursor material and the electroactive polymer precursor material. In some examples, the extruded electrode precursor material and electroactive polymer precursor material may be deposited onto a substrate.

In one embodiment, the first manifold inlet opening may have a first side region and first parallel protruding regions that overlap and that may be connected to the first side region. In another embodiment, the second manifold inlet opening may have a second side region and second parallel protruding regions that overlap and may be connected to the second side region. In one embodiment, the third manifold inlet opening may have interconnected protruding regions that overlap and may be sandwiched between the first parallel protruding regions and the second parallel protruding regions.

In another embodiment, the method may further include (i) curing the electrode precursor material to form an electrically conductive material, the electrically conductive material including approximately 20% nanovoids by volume and including a polymer and a conductive filler, and (ii) curing the deposited electroactive polymer precursor material to form an electroactive polymer element including a cured elastomer material. In one embodiment, the cured elastomer material may include at least one non-polymeric component in a plurality of defined regions, and the method further may include removing at least a portion of the at least one non-polymeric component from the cured elastomer material to form a nanovoided polymer material. In one embodiment, the conductive filler includes one or more of carbon particles, graphene, carbon nanotubes, metal particles, or metal wires. In another embodiment, a thickness of the electroactive polymer element is less than approximately 10 μm, and the thickness of the electroactive polymer has a variance of less than approximately 10%.

In one embodiment, the method may further include combining the electroactive polymer precursor material with at least one non-curable component to form a mixture. In one embodiment, the method may further include flowing the layered electroactive polymer precursor material and electrode precursor material along an internal flow path extending to the manifold outlet opening. In another embodiment, the flowing the layered electroactive polymer precursor material and electrode precursor material along the interior flow path may further include maintaining a laminar flow of the layered electroactive polymer precursor material and electrode precursor material along the internal flow path.

In some embodiments, a manifold extrusion die is described. The manifold extrusion die may include (i) a first manifold inlet opening and a second manifold inlet opening configured to flow an electrode precursor material into the manifold extrusion die, (ii) a third manifold inlet opening configured to flow an electroactive polymer precursor material into the manifold extrusion die such that the electroactive polymer precursor material may be layered between alternating layers of the electrode precursor material from the first and second manifold inlet openings, and (iii) a manifold outlet opening configured to deposit the electrode precursor material and the electroactive polymer precursor material.

In one embodiment, the first manifold inlet opening may include a first side region and first parallel protruding regions that overlap and that may be connected to the first side region, and the second manifold inlet opening may include a second side region and second parallel protruding regions that overlap and are connected to the second side region. In another embodiment, the third manifold inlet opening may include interconnected protruding regions that overlap and are sandwiched between the first parallel protruding regions and the second parallel protruding regions.

In one embodiment, an extrusion apparatus is described. The extrusion apparatus may include a manifold extrusion die including (i) a first manifold inlet opening and a second manifold inlet opening configured to flow an electrode precursor material into the manifold extrusion die, (ii) a third manifold inlet opening configured to flow an electroactive polymer precursor material into the manifold extrusion die such that the electroactive polymer precursor material may be layered between alternating layers of the electrode precursor material from the first and second manifold inlet openings, and (iii) a manifold outlet opening configured to deposit the electrode precursor material and the electroactive polymer precursor material. The extrusion apparatus may also include a substrate conveyance system configured to move a substrate with respect to the manifold outlet opening.

In another embodiment, the substrate conveyance system may include a rotating surface configured to move the substrate. In one embodiment, the substrate conveyance system may include a rotating drum including the rotating surface. In another embodiment, the cured elastomer material may include at least one non-polymeric component in a plurality of defined regions, and the apparatus may be further configured to remove at least a portion of the at least one non-polymeric component from the cured elastomer material to form a nanovoided polymer material. In one embodiment, the apparatus may further include at least one of a heat source or an actinic radiation source configured to cure the electrode precursor material to form an electrically conductive material, and cure the deposited electroactive polymer precursor material to form an electroactive polymer element including a cured elastomer material. In another embodiment, the apparatus may be configured to combine the electroactive polymer precursor material with at least one non-curable component to form a mixture.

While the exemplary embodiments described herein are susceptible to various modifications and alternative forms, specific embodiments will be described in detail herein. However, the exemplary embodiments described herein are not intended to be limited to the particular forms disclosed. Rather, the instant disclosure covers all modifications, equivalents, and alternatives falling within this disclosure.

Features from any of the embodiments of the present disclosure may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
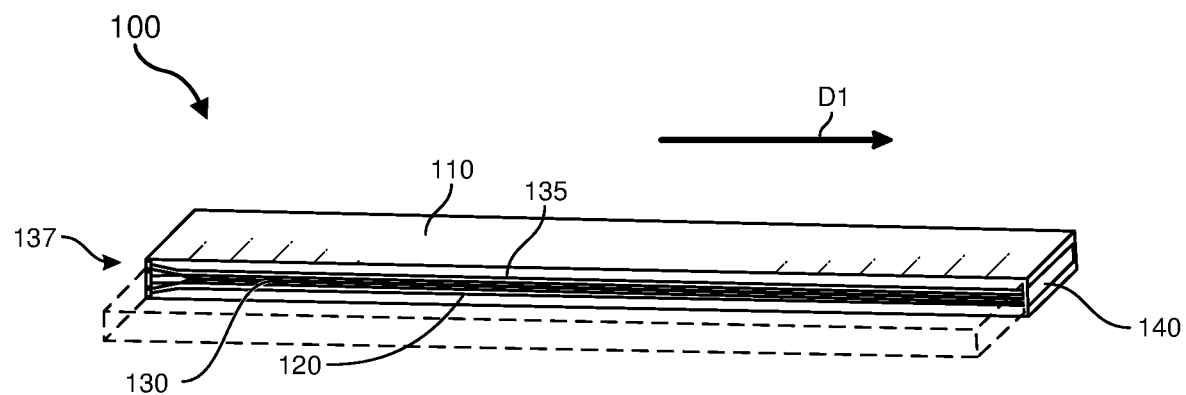
FIG. 1 shows a cross-sectional view of a system for the fabrication of an electroactive device, in accordance with example embodiments of the disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

As will be explained in greater detail below, embodiments of the instant disclosure are generally directed to layered electroactive materials and corresponding electroactive devices, and methods and systems for manufacturing or forming such layered electroactive materials.

In various embodiments, an electroactive device (e.g., actuator) based on electroactive materials such as electroactive polymers is described. In another embodiment, the electroactive polymers may be made by coating a polymer (e.g., elastomeric polymer) with two abutting materials including electrodes, and by applying a pre-loaded strain to the electroactive polymer and abutting material system. Further, the application of a voltage between the two abutting materials may create a force acting on the electroactive polymer, which may influence the geometry of the electroactive polymer and may reduce the strain of the system.

In another aspect, the polymers used in such an electroactive device may be relatively thick (e.g., resulting from various manufacturing process that may be used to fabricate the electroactive device). Accordingly, the electroactive device may require a relatively high operating voltage. Moreover, the use of thicker polymer layers may reduce the breakdown voltage of the electroactive polymers in the electroactive device, which may in turn reduce the overall force that can be generated by an electroactive device such as an actuator. In some embodiments, thinner polymer layers may be used in electroactive devices; however, the use of such thin polymer layers may increase fabrication costs and may increase the variability of fabricated electroactive devices during the manufacturing process. In various embodiments, an electroactive device (e.g., an actuator) may include thin polymer layers that reduce the operational voltage of the electroactive device, while including multiple layers to increase the total generated force of the electroactive device.

As used herein, "electroactive polymers" may refer to polymers that exhibit a change in size or shape when stimulated by an electric field. Some electroactive polymers may find limited applications due to a low breakdown voltage of the polymers with respect to the operating voltage used by electroactive devices (e.g., actuators) that use the polymers. Accordingly, electroactive devices with reduced operating voltages and higher energy densities may be useful for many applications.

In particular, the electroactive device may include an electroactive polymer laminate-based (e.g., multilayer) actuator. The actuator may include a first abutting material (e.g., an electrode), an electroactive polymer including a dielectric polymer, and a second abutting material (e.g., an electrode). Further, the abutting layer, the electroactive polymer, or both may include asymmetric components in a given orientation in the plane of the laminate. In another aspect, the asymmetric components may include conductive materials (e.g., particles). In an embodiment, "asymmetric components" may refer to active or inactive particles (e.g., filaments such as nanowires, nanotubes, including carbon nanotubes), two-dimensional conductors (e.g., as graphene), or chains of particles (e.g., carbon black).

In various embodiments, methods and apparatuses for forming multilayer electroactive devices that include stacked electroactive polymer layers and electrodes are described. In particular, a manifold extrusion die may allow for the simultaneous formation of the multiple layers of the stacked electroactive device. In particular, an electrode precursor fluid may flow into the manifold extrusion die via first and second manifold openings that each have a side region and multiple parallel protruding regions that overlap and are connected to the respective side regions. An electroactive polymer precursor fluid may simultaneously flow into the manifold extrusion die via a third manifold opening having interconnected protruding regions that overlap and are sandwiched between the protruding regions of the first and second manifold openings. The resulting layered electrode precursor fluid and polymer precursor fluid may be brought into contact with each other and may form a laminar flow as they are co-flowed through the manifold extrusion die. Additionally, the electrode precursor fluid and the electroactive polymer precursor fluid may partially diffuse into each other as the materials flow to the exit of the manifold extrusion die. The exiting layered precursor materials may be deposited on a substrate (e.g., a substrate on a rotating drum) and may be exposed to, for example, actinic radiation to cure the precursor materials so as to form the multilayer electroactive device. In another embodiment, selected manifold extrusion dies may be used to form either sheet-like or cylindrical electroactive polymer devices.

In some embodiments, the polymer precursor fluid may include a polymer precursor fluid that may be hardenable. The polymer precursor fluid may be a monomer and/or an emulsion. In one aspect, a "polymer precursor fluid" may refer to a fluid that can be hardened (increased viscosity or modulus) by either curing, removing a solvent, or a combination thereof. In another aspect, the polymer precursor fluid may include a polymer dissolved in a solvent. Further, the polymer precursor fluid may be a monomer, an emulsion, a polymer dissolved in a solvent, combinations thereof, and/or the like.

According to various embodiments, electroactive devices based on the disclosed layered electroactive materials (e.g., electroactive polymers) may be used to actuate deformable optical elements in optical assemblies (e.g., lens systems). Such electroactive devices may convert electrical energy to mechanical energy (e.g., an actuator), but may also be configured to convert mechanical energy to electrical energy (e.g., an energy harvesting device). Examples of electroactive devices may include, without limitation, actuators, sensors, microelectromechanical devices, and/or any other suitable devices. In various embodiments, electroactive devices may include paired electrodes, which allow the creation of the electrostatic field that forces constriction of the electroactive polymer.

In some examples, an "electrode," as used herein, may refer to a conductive material, usually a film or a layer. In other aspects, the term electrode and abutting material may be used interchangeably herein. In another aspect, the electrode may include a liquid that can be hardened to form a conductive material. In another aspect, the electrode material may refer to a fluid for the extrusion operation for the fabrication of an electrode.

In the presence of an electrostatic field, an electroactive polymer may deform (e.g., compress, elongate, bend, etc.) according to the strength of that field. Generation of such a field may be accomplished, for example, by placing the electroactive polymer between two electrodes, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

The physical origin of the compressive nature of electroactive polymers in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance, in this case, is the change of strain with respect to stress or, equivalently, in more practical terms, the change in displacement with respect to force.

In at least one embodiment, the mixture may contain at least an average of approximately 10% by weight of solvent (e.g., approximately 20%, approximately 30%, approximately 50%, and the like). In some embodiments, as will be described in greater detail below, such a solvent may be utilized, for example, to form nanovoids in the curable material and/or the cured material. In another embodiment, the curable material may be cured in any suitable manner, for example, by using a source of actinic energy. In another embodiment, actinic energy may include, but not be limited to, x-rays, ultraviolet radiation, electron beams, and the like. The curing process may also be initiated by, for example, remotely forming the free-radical initiator and bringing that in contact with the curable material. Further, for a multilayer electroactive device including multiple applications of the mixture of curable material and non-curable material, the multilayer may be cured sequentially (e.g., between the application of the layers), or a once (e.g., at the end of the deposition of the multilayer). The methods and systems shown and described herein may be used to form electroactive devices having multiple layers (e.g., a few layers to tens, hundreds, or thousands of stacked layers). For example, an electroactive device may include a stack of from two electroactive polymer elements and corresponding electrodes to thousands of electroactive polymer elements (e.g., from 2 electroactive polymer elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, greater than approximately 2000 electroactive polymer elements).

In some embodiments, the curable material may include a silicone resin, such as, for example polydimethylsiloxane (PDMS). In another embodiment, if the curable material is PDMS, then a cavitation agent for forming nanovoids in the curable material and/or the cured material may include a thermal or an ultra-violet (UV) initiated hydrosilation catalyst. Suitable hydrosilation catalysts may include, but not be limited to, bis(acetylacetonate)platinum II, n(2-cyclopentadienyl) trialkylplatinum, and the like. Additionally, or alternatively, the curable material may include, but not be limited to, acrylates, styrenes, polyesters, polycarbonates, epoxies, and the like.

As noted, the electroactive devices (e.g., actuators) may include at least a first conductive material and a second conductive (e.g., serving as electrodes). Further, a polymer material having nanovoids (e.g., a nanovoided polymer) may be disposed between the first and the second conductive materials. In some embodiments, the nanovoided polymer material may include particles of a material with a high dielectric constant (e.g., barium titanate). The particles may have an average diameter of between approximately 10 and approximately 1000 nm (e.g., between approximately 10 and approximately 100 nm, between approximately 20 and approximately 100 nm, and the like).

In various embodiments, the nanovoided materials may also include a surfactant. In some embodiments, the surfactant may provide improved compatibility between the polymer and monomer, or between the polymer and the solvent. Alternatively, or in addition, the surfactant may reduce the surface energy of the nanovoids, which can reduce adhesive forces when the nanovoids are compressed.

In one embodiment, the mixture of the curable material and the non-curable material, the first conductive material, and the second conductive material (and any additional materials and layers) may be disposed (e.g., on a substrate) in any suitable manner. A "substrate," as used herein, may generally refer to any material (e.g., a layer) on which another layer or element is formed. In another embodiment, such material may be printed (e.g., via inkjet printing, silkscreen printing, etc.). In some aspects, inkjet printing can refer to a type of computer printing that operates by propelling droplets of material onto a substrate (e.g., a flexible or inflexible substrate). In another aspect, silkscreen printing can refer to a printing technique whereby a mesh is used to transfer a material (e.g., curable material and/or non-curable material) onto a substrate (e.g., a flexible or inflexible substrate), except in areas made impermeable to the material by a blocking stencil. A blade or squeegee may be moved across the screen to fill the open mesh apertures with the material, and a reverse stroke then causes the screen to touch the substrate momentarily along a line of contact. This causes the material to wet the substrate and be pulled out of the mesh apertures as the screen springs back after the blade has passed. In one embodiment, the materials may be vaporized (e.g., via thermal evaporation, chemical vapor deposition (CVD), physical vapor deposition (PVD), and the like). In another embodiment, the materials may be disposed using a co-flow process and/or a roll-to-roll process. In some embodiments, monomers, oligomers, and/or prepolymers for forming electroactive polymer materials may optionally be mixed with a solvent and the solvent may be removed from the electroactive polymer element during and/or following curing to form nanovoids within the electroactive polymer element. In some embodiments, the material may be extruded, cured, and dried without deposition onto a substrate.

Methods of forming an electroactive device include forming electrodes and electroactive polymer materials sequentially (e.g., via vapor deposition, coating, printing, etc.) or simultaneously (e.g., via co-flowing, co-extrusion, slot die coating, etc.), as will be described in greater detail below. Alternatively, the electroactive polymer materials may be deposited using initiated chemical vapor deposition (iCVD), where, for example, suitable monomers of the desired polymers may be used to form the desired coating. In some embodiments, monomers, oligomers, prepolymers, and/or polymers for forming the electroactive polymer may optionally be mixed with a solvent and the solvent may be removed from the electroactive polymer during and/or following curing to form nanovoids within the electroactive polymer.

Figure 13:
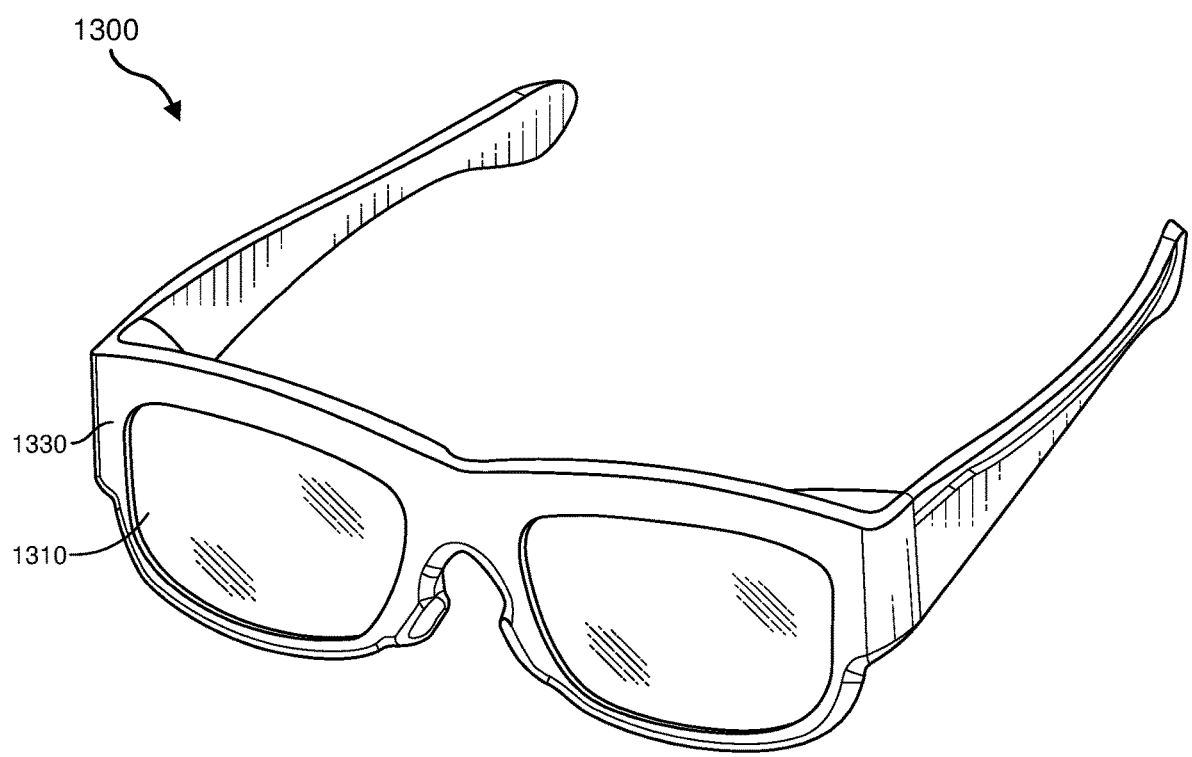
FIG. 13 shows a diagram of an example head mounted device (HMD), in accordance with example embodiments of the disclosure.
Figure 14:
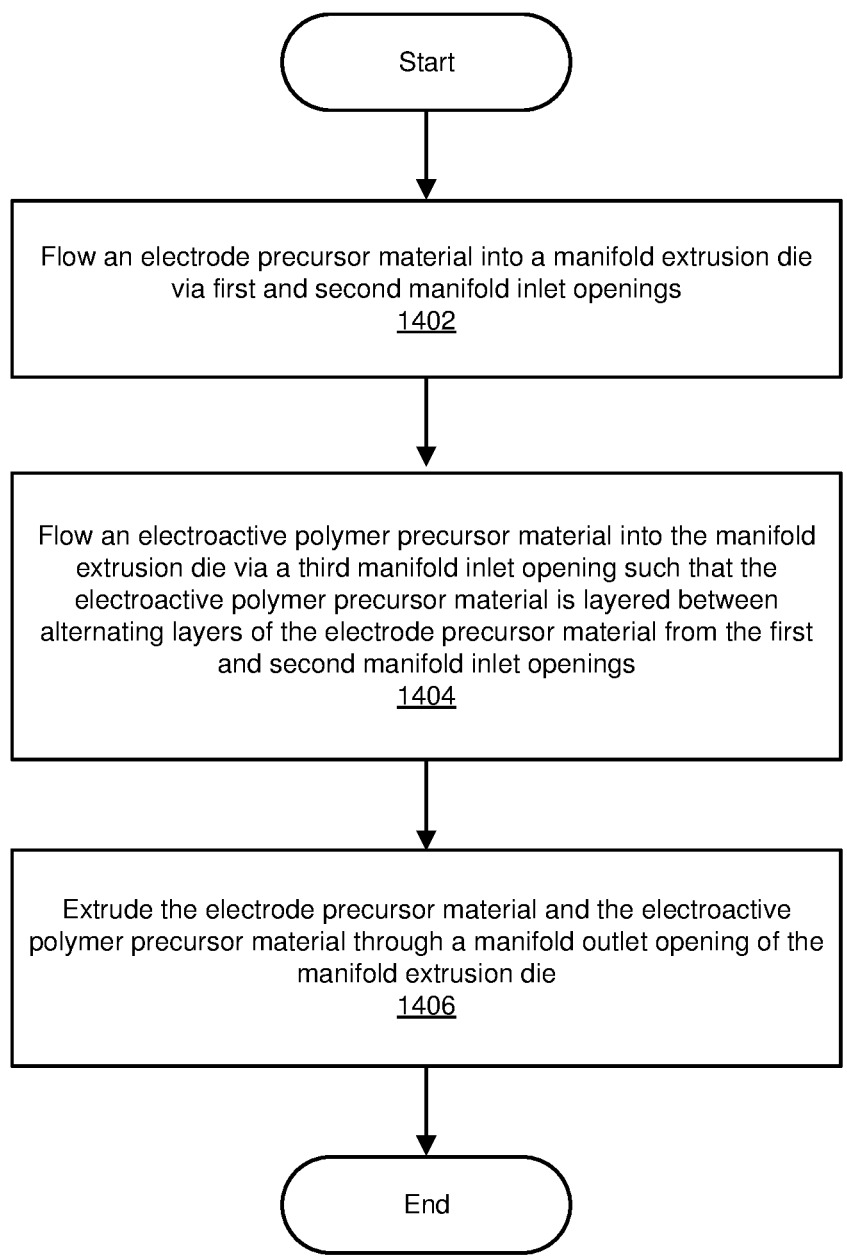
FIG. 14 shows a diagram of an example flow chart illustrating aspects of the fabrication of electroactive devices, in accordance with example embodiments of the disclosure.

The following will provide, with reference to FIGS. 1-14, detailed descriptions of systems, methods, and apparatuses for layer electroactive materials for use in connection with electroactive devices, and the fabrication thereof. In particular, the discussion associated with FIGS. 1-4 includes descriptions of fabrication systems and methods that may be used to make the electroactive devices having layered electroactive materials in accordance with various embodiments. The discussion relating to the embodiments depicted in FIGS. 5-6 describe example electroactive devices including layered electroactive materials that may be fabricated in accordance with example embodiments of the disclosure. The discussion relating to the embodiments depicted in FIGS. 7-8 describe example die structures that may be used in the fabrication of the electroactive devices described herein, in accordance with example embodiments of the disclosure. The discussion relating to the embodiments depicted in FIGS. 9-10 include descriptions of example deformable element (e.g., liquid lens) designs and devices incorporating the electroactive devices described herein. The discussion relating to the embodiments depicted in FIGS. 11-12 includes lens assembly devices including the electroactive devices described herein, in accordance with example embodiments of the disclosure. The discussion relating to the embodiment depicted in FIG. 13 shows an example of a near-eye-display having lenses that may be actuated with the disclosed electroactive devices described herein. Additionally, the discussion corresponding to FIG. 14 provides an example of a method for forming electroactive devices. While many of the examples discussed herein may be directed to head-worn display (HMD) systems, embodiments of the instant disclosure may be implemented in a variety of different types of devices and systems.

FIG. 1 shows a cross-sectional perspective view of a system for the fabrication of an electroactive device, in accordance with embodiments of the disclosure. In particular, FIG. 1 shows a system 100 (e.g., a die-slot flowing system) for positioning, using a co-extrusion process, a mixture including a curable material (e.g., resin, monomer, or both) and a non-curable material between two abutting materials (e.g., electrodes and/or electrode-forming materials), as will be further explained below. As noted the curable material may include a resin. In various embodiments, a resin may refer to a polymer melt, monomers, oligomers, pre-polymers, polymers, or combinations thereof. In another aspect, the resin may optionally include a solvent. In another aspect, multiple monomers, oligomers, pre-polymers, polymers (e.g., polymers including, but not limited to, homopolymers, copolymers, and block copolymers), and/or solvents may be mixed together to form the resin.

In an embodiment, the system may include a die 110. In an embodiment, the die 110 may be used to position various volumes, layers and/or mixtures of materials as described below. In particular, the die 110 may be configured to hold and flow a mixture, or multiple mixtures in multiple respective layers, that may be streamed into the die 110 at entrance 137. Further, such a mixture or combination of layered mixtures may develop a laminar flow through die 110 and may exit die 110 at discharged at position 140.

In an embodiment, FIG. 1 shows the die 110 including, for example, a curable material and a non-curable material in a mixture 130. In an embodiment, the non-curable material may include a cavitation agent and/or a solvent. In another embodiment, if the curable material includes, for example, PDMS, then the cavitation agent may include a thermal or an ultra-violet (UV) initiated hydrosilation catalyst. Suitable hydrosilation catalysts may include, but not be limited to, bis(acetylacetonate)platinum II, n(2-cyclopentadienyl) trialkylplatinum, and the like. In an embodiment, the mixture 130 may be cured to form a nanovoided polymer material. In at least one embodiment, the die 110 may further include the mixture 130 disposed adjacent to a first abutting material 120 and/or a second abutting material 135, as illustrated in FIG. 1. For example, as shown in FIG. 1, mixture 130 may be disposed between the first abutting material 120 and the second abutting material 135. The first abutting material 120 and/or the second abutting material 135 may include an electrically conductive material that may serve as, and/or may be cured to form, an electrode in the electroactive device.

In an embodiment, the first abutting material 120, the mixture 130, and/or the second abutting material 135 may enter the die 110 at position 137 and may be flowed (i.e., co-flowed) in direction D1 through the die 110 and discharged from one side of the die 110 at position 140. The layered combination of materials discharged at position 140 of the die 110 may then be applied to a substrate (not shown). In some embodiments, the mixture 130 may be processed as it is drawn through die 110 and/or after it is discharged from die 110 to cure the mixture, to remove one or more materials (e.g., a solvent, degradation products from a cavitation agent, etc.) from the mixture 130, and/or to bond the mixture 130 to the first abutting material 120 and/or the second abutting material 135. Additionally or alternatively, the first abutting material 120 and/or the second abutting material 135 may be processed as they are drawn through die 110.

In another aspect, the first abutting material 120 and/or the second abutting material 135 (e.g., the electrodes) include an electrode material that may be a liquid that can be hardened to form a conductive material. In another aspect, the electrode material may refer to a fluid for the extrusion operation for the fabrication of an electrode. In another aspect, the electrode material may remain in a fluid state during fabrication. For example, the electrode may include a conductive filler (e.g., carbon black) in a fluid (e.g., oil). In another aspect, the electrode material may include a material that is a fluid at elevated temperatures and solidifies at lower temperatures, including the operating temperature of the electroactive device. The electrode material may include a conductive material dispersed in one or more of the materials described in a hardenable polymer precursor fluid.

In other embodiments, the electrodes may include relatively thin, electrically conductive layers or elements and may be of a non-compliant or compliant nature. Any suitable materials may be utilized in the electrodes, including electrically conductive materials suitable for use in thin-film electrodes, such as, for example, aluminum, transparent conductive oxides, silver, indium, gallium, zinc, carbon nanotubes, carbon black, and/or any other suitable materials. In some embodiments, the electrode or electrode layer may be self-healing, such that damage from local shorting of a circuit can be isolated. Suitable self-healing electrodes may include thin films of metals, such as, for example, aluminum.

In one aspect, the mixture 130 may include a fluid that may be made of one or more monomers, including, but not limited to, ethyl acrylate, butyl acrylate, octyl acrylate, ethoxy ethyl acrylate, 2-chloroethyl vinyl ether, chloromethyl acrylate, methacrylic acid, allyl glycidyl ether, and/or N-methylol acrylamide. Other curing agents such as polyamines, higher fatty acids, higher fatty acids esters, and/or sulfur may be used. Further, curing agents may include but not limited to, styrenes, epoxies, isocyanates, and mixtures thereof. In another aspect, the fluid may include polymers dissolved in solvents, such as aliphatic, aromatic, or halogenated hydrocarbons, or combinations thereof. In one aspect, the fluid may contain a non-solvent, for example, to create an emulsion. The non-solvent may be organic (e.g., a hydrocarbon), inorganic (e.g., water), and/or a highly polar organic compound (e.g., ethylene glycol). In one aspect, emulsions may require a surfactant. The surfactant may be ionic or nonionic surfactants and may include, for example, Span 80 available from Sigma-Aldrich Company.

In some examples, solvent may be evaporated from nanovoids of the electroactive material. In some examples, partial solvent evaporation may be allowed before full curing of the mixture 130 forming the electroactive material. This may induce partial nanovoid collapse, and formation of anisotropic nanovoids, such as, for example, ovoid and/or disk-shaped nanovoids. The mixture 130 may, for example, be partially cured before partial (or complete) solvent removal from the electroactive material, for example, to achieve partial (or otherwise limited) nanovoid collapse. Following partial curing and at least partial removal of the solvent from the nanovoids, the mixture 130 may be further cured and remaining solvent may then be removed, leaving anisotropic nanovoids in the resulting electroactive material. In some embodiments, such initial partial curing and subsequent curing may be accomplished via, for example, a two-stage polymerization process to form a network of first and second stage polymers.

In another embodiment, mixture 130 may include an emulsion of polymer forming components that may be partially cured, and the partially cured emulsion may be stretched (e.g., stretched optionally while the emulsion is on a substrate) in one or two directions (e.g., orthogonal directions). Further, the stretching may be about 1.5×, (alternatively about 2×, alternatively about 3×, alternatively about 5× the original dimensions of the emulsion). Afterwards, the emulsion may be further cured and the solvent may be removed thereafter.

In some embodiments, while one embodiment (i.e., die-slot flowing or co-flowing) is shown and described in detail herein, the materials of the present disclosure may be formed by a variety of means that would be understood by those skilled in the art. For example, the materials may be cast, blown, calendared, mono-extruded, co-extruded, chill cast, nip embossed, or any other method which would result in layers of materials compatible with the process described herein.

Figure 2:
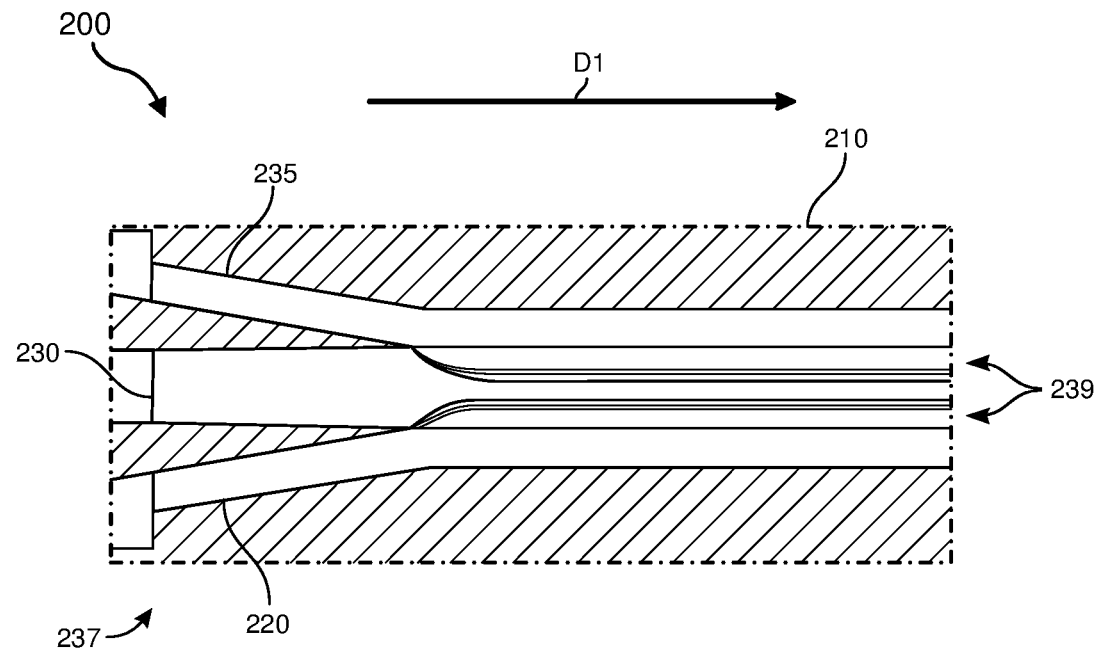
FIG. 2 shows a mixture shown in system 100 of FIG. 1, in accordance with example embodiments of the disclosure.

FIG. 2 shows a system 200 corresponding to a portion of system 100 of FIG. 1, in accordance with example embodiments of the disclosure. In particular, FIG. 2 shows the mixture 230 shown in system 100 of FIG. 1, which may include a curable material and non-curable material (e.g., a cavitation agent and/or a solvent). In an embodiment, the mixture 130 may be cured to form a nanovoided polymer material.

In another embodiment, FIG. 2 also shows a first abutting material 220, which may include an electrically conductive material that may serve as or that may form a first electrode in the electroactive device. In an embodiment, FIG. 2 further shows a second abutting material 235, which may include an electrically conductive material that may serve as or that may form a second electrode in the electroactive device. As illustrated in FIG. 2, mixture 230, first abutting material 220, and/or second abutting material 235 may each enter die 210 at, for example, position 237, via a separate passageway. As mixture 230, first abutting material 220, and/or second abutting material 235 are drawn through die 210 in direction D1, mixture 230, first abutting material 220, and/or second abutting material 235 may be brought into close contact with each other such that mixture 230 abuts first abutting material 220, and/or second abutting material 235. For example, mixture 230 may be disposed between first abutting material 220 and second abutting material 235 as mixture 230, first abutting material 220, and second abutting material 235 are flowed and/or extruded through die 210. In some examples, some diffusion between adjacent materials may occur as the streams merge during co-flow through die 210. For example, mixture 230 may at least partially mix with first abutting material 220 and/or second abutting material 235 in one or more diffusion regions 239 shown in FIG. 2.

Figure 3:
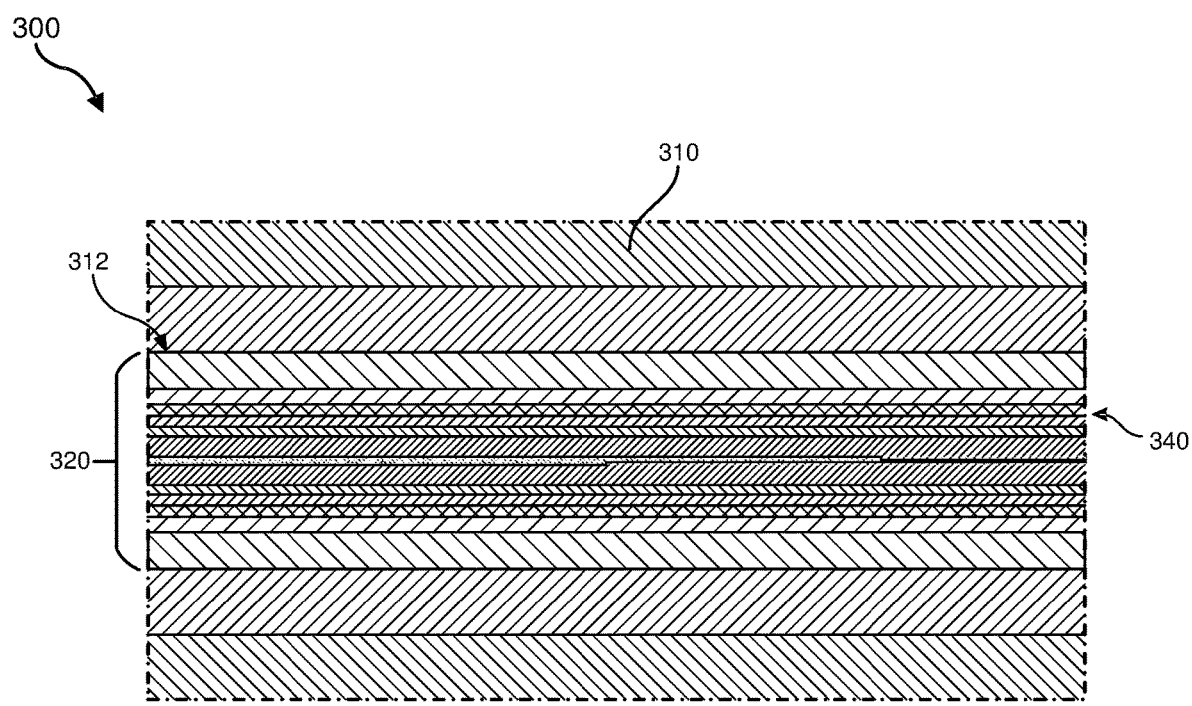
FIG. 3 shows a diagram of a section of a portion of a die similar to the die of FIG. 2, in accordance with example embodiments of the disclosure.

FIG. 3 shows a diagram of a section of a portion of a system 300 including a die 310 similar to the die 210 shown and described in connection with FIG. 2, above, in accordance with example embodiments of the disclosure. In particular, the portion of the die 310 illustrated in FIG. 3 may include a layered material 320 flowing (e.g., laminar flow) through a cavity 312 of the die 310 towards an exit 340. Further, FIG. 3 shows a concentration gradient of at least a portion of the layered material 320 (e.g., mixture 230 shown and described in connection with FIG. 2, above, and including, for example, an electroactive polymer resin) in the center of the cavity 312 and abutting materials (e.g., first abutting material 220 and/or second abutting material 235, shown and described in connection with FIG. 2, above and including, for example, an electrode resin) bounding surfaces of the die cavity 310. Such a concentration gradient may develop, for example, due to partial mixing of materials in adjacent layers of layered material 320.

Figure 4A:
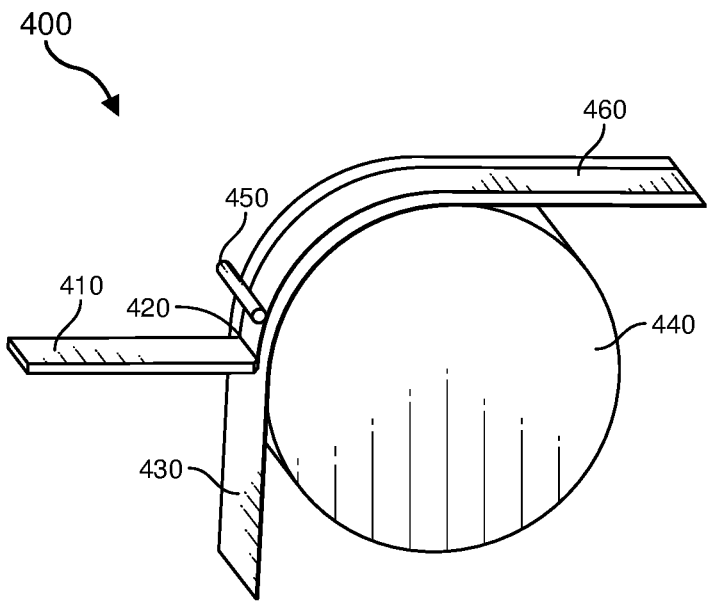
FIGS. 4A and 4B show an apparatus for the fabrication of an electroactive device, in accordance with one or more embodiments of the disclosure.
Figure 4B:
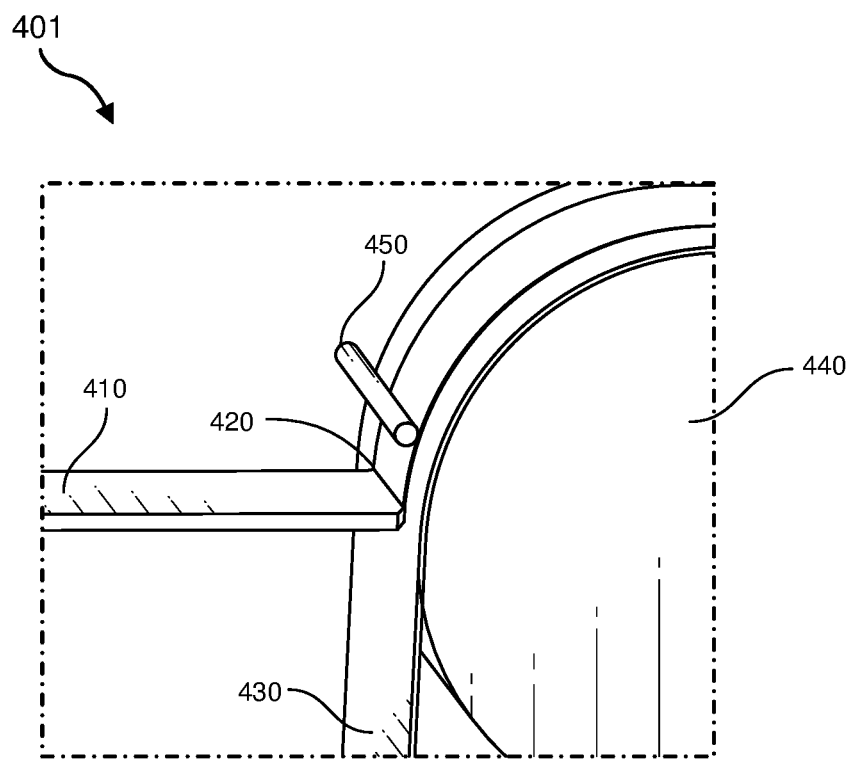

FIGS. 4A and 4B illustrate aspects of an apparatus used for the fabrication of an electroactive device, in accordance with one or more embodiments of the disclosure. In particular, FIG. 4A show an apparatus 400 (for example, a roll-to-roll apparatus) that may be used for the rapid fabrication of electroactive devices as described herein. In some embodiments, the apparatus 400 may be used to simultaneously form a layered stack that includes a polymer material (e.g., an electroactive polymer) layered with an abutting layer and/or layered between two abutting layers (e.g., electrodes), as described in connection with FIGS. 1-3, above. FIG. 4B shows a close-up view of a portion 401 of the apparatus 400 shown and described in connected with FIG. 4A.

In particular, the apparatus 400 may be used to form a layered stack of a curable material layered with one or two abutting layers (which may also be curable) discharged from a die 410 onto a substrate 430 that is continuously moved by rotational member 440 (e.g., a rotational drum) as the layered stack is discharged. The apparatus 400 may include a blade (e.g., a doctor blade, not shown) for evenly dispensing the layered stack of materials onto substrate 430. The layered stack may be dried (e.g., to remove a solvent, degradation products from a cavitation agent, etc.) and cured on substrate 430. For example, a curing source 450 may cure at least a portion of the stack to form cured layered. Curing source 450 may include, for example, an x-ray emitter, a UV light emitter, an electron beam emitter, a carbon compound (e.g., graphene), etc. The cured stack may be used, for example, in at least a portion of an electroactive actuator as described herein.

In an embodiment, the apparatus 400 may include a die 410. In another embodiment, while only one die 410 is shown, a multiplicity of dies similar to die 410 may be used in the apparatus 400, for example, for the fabrication of a multilayer electroactive device. In an embodiment, the die 410 may be similar to the dies shown and described in connection with FIGS. 1 and 2 (e.g., dies 100 and 200) described above. In some examples, apparatus 400 may include multiple co-flowing dies (e.g., die 410) to simultaneously form a plurality of electrodes layered with a plurality of electroactive polymer elements in a multilayer stack of from two electroactive polymer elements and corresponding electrodes to thousands of electroactive polymer elements.

In an embodiment, the apparatus 400 further shows flowed material 420. In an embodiment, the flowed material 420 may include a first abutting material, such as first abutting material 220, a mixture, such as mixture 230, and a second abutting material, such as second abutting material 235 (see FIG. 2).

In an embodiment, the flowed material 420 may include one layer (e.g., similar to a first abutting material 220 or a mixture 230 of FIG. 2). In another embodiment, the flowed material 420 may include two layers. In another embodiment, the flowed material 420 may include multiple layers (e.g., a first abutting material, a first mixture, a second, third, fourth, etc. mixture(s), and/or a second abutting material).

In an embodiment, the apparatus 400 may also include a substrate 430. In some embodiments, the substrate 430 may include a flexible material. In an embodiment, the flexible material may withstand a predetermined bend radius to be able to work with the rotational member 440 of the apparatus 400. This may allow the flexible material to be used in a roll-to-roll manufacturing process.

In an embodiment, apparatus 450 further shows a rotational member 440. In an embodiment, the rotational member 440 (e.g., a rotational drum or surface) may serve to allow for the extrusion of the flowed material 420 through the die 410 to be deposited on the substrate 430 as the rotational member 440 rotates.

In another embodiment the apparatus 400 may include a curing source 450. In an embodiment, the curing source 450 may at least partially cure the flowed material 420 and/or the substrate 430 as the rotational member 440 pulls the flowed material 420 and the substrate 430 past the curing source 450. In an embodiment, the curing source 450 may include a source of actinic energy (e.g., UV energy, heat, etc.). In an embodiment, FIGS. 4A and 4B further show the cured material 460 that has passed through the curing source 450. In an embodiment, the cured material 460 may be cut (for example, using a knife or bladed instrument) or otherwise segmented into multiple electroactive devices.

In one embodiment, the electroactive devices (e.g., actuators) made by the methods shown and described in connection with FIGS. 1-4, above, may be different than other methods such as vapor coating in that the electrodes of the disclosed electroactive devices may be a composite material of a conductive material and a binder such as a conductive filler material. For example, an electroactive polymer layer containing at least about 20% by volume voids and an electrode layer made of a composite of a polymer and a conductive filler. Further, the conductive filler may include, but not be limited to, one or more of carbon particles, graphene, carbon nanotubes, metal particles, metal wires, combinations thereof, and/or the like. In another embodiment, the thickness of the electroactive materials of the electroactive devices fabricated using the methods shown and described in connection with FIGS. 1-4B may be less than approximately 10 µm thick and may have a thickness variance of less than approximately 10% (alternatively, less than approximately 5%, alternatively, less than approximately 2%). In particular, the extruded layers for the disclosed electroactive devices may have increased uniformity, which may be important in increasing working voltage of the electroactive devices.

Figure 5:
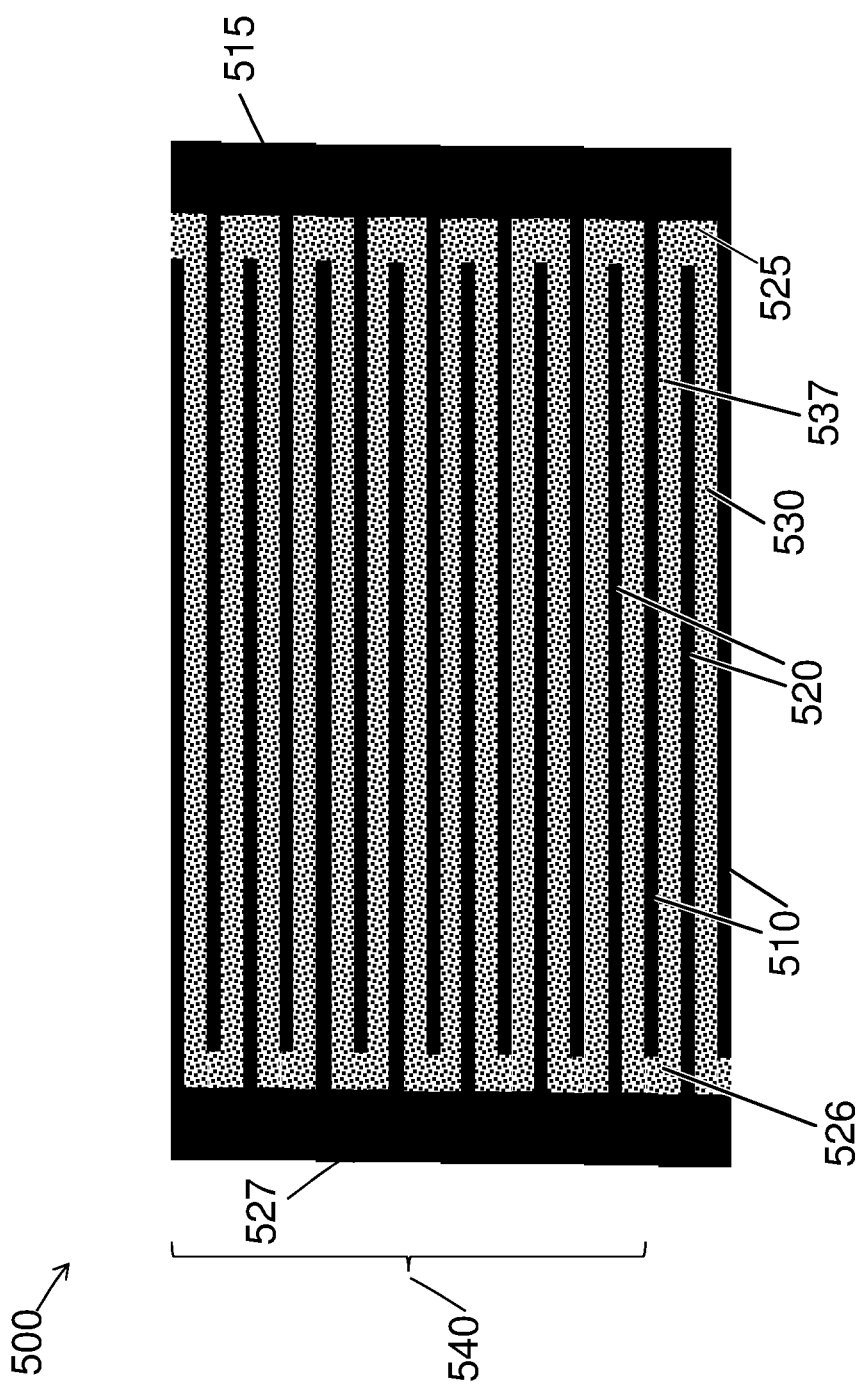
FIG. 5 shows an example cross-sectional view of an electroactive device, in accordance with example embodiments of the disclosure.

FIG. 5 shows an example cross-sectional view of an electroactive device 500, in accordance with some embodiments. In particular, the electroactive device 500 shown in FIG. 5 includes a layered stack of materials to be described below. Further, the electroactive device 500 may be fabricated, for example, by depositing a layered precursor mixture on a substrate, as described above in reference to FIGS. 1-4B. In some embodiments, the electroactive device 500 may be an actuator and/or any other suitable electroactive device. In an embodiment, the electroactive device 500 may include a substrate (e.g., a rigid substrate such as glass, sapphire and the like, or a flexible substrate such as paper, metal foil, plastic, and the like). In at least one embodiment, the electroactive device 500 may include a first electrode material 510, which may be alternatively referred to as a first electrode herein. The first electrode material 510 may include an electrically conductive material and may serve as an electrode for the electroactive device 500. In an embodiment, the electroactive device 500 may optionally include a common bus 515 or contact area. For example, the common bus 515 may include and/or may be electrically connected to one or more layers (e.g., overlapping layers) of the first electrode material 510 (e.g., a portion of the electronic conducting material serving as an electrode).

In an embodiment, the electroactive device 500 may include a first electroactive material 530, such as a first nanovoided polymer material. In some embodiments, the first nanovoided polymer material may include a silicone resin, such as, for example, polydimethylsiloxane (PDMS). Additionally or alternatively, the first nanovoided polymer material may include, but not be limited to, acrylates, styrenes, polyesters, polycarbonates, and epoxies, and/or any other suitable polymer material.

In another embodiment, the electroactive device 500 may include a first insulating area 525, and in some examples, the first insulating area 525 may include a portion of the first nanovoided polymer material. In an embodiment, the electroactive device 500 may include a contact area 527. The contact area 527 may be similar to the common bus 515 and may be optional. The contact area 527 may allow for a connection (e.g., an electrical connection), to one or more layers (e.g., overlapping layers) of second electrode material 520, which may be referred to as second electrodes herein. The second electrode material 520 may include an electrically conductive material that may serve as one or more electrodes. In an embodiment, the electroactive device 500 may include a second insulating area 526. The second insulating area 526 may include a portion of a second electroactive material 537, such as a second nanovoided polymer material.

In certain embodiments, the electroactive device 500 may further include one or more additional electroactive material layers and/or abutting material layers (e.g., electrodes) 540 overlapping in a stacked configuration having from three electroactive material layers and corresponding electrodes to thousands of electroactive material layers. Accordingly, as shown in FIG. 5, layers of first electrode material 510 may be separated from layers of second electrode material 520 by layers of electroactive material (e.g., first electroactive material 530 and second electroactive material 537).

In an embodiment, the substrate (not shown) may include one or more transparent materials such as a sapphire or glass. In one embodiment, the substrate may include silicon, silicon oxide, silicon dioxide, aluminum oxide, sapphire, an alloy of silicon and germanium, and/or indium phosphide (InP), and the like. In some embodiments, the substrate may include a semiconductor material (e.g., monocrystalline silicon, germanium, silicon germanium, SiGe, and/or a group III-V based material (e.g., gallium arsenide), or any combination thereof. In various embodiments, the substrate 105 may include a polymer-based substrate, glass, or any other bendable substrate including two-dimensional materials (e.g., graphene and molybdenum disulfide), organic materials (e.g., pentacene), transparent oxides (e.g., indium gallium zinc oxide (IGZO)), polycrystalline group III-V materials, polycrystalline germanium, polycrystalline silicon, amorphous III-V materials, amorphous germanium, amorphous silicon, or any combination thereof.

In other embodiments, the substrate may include a flexible substrate and may be used in connection with printing or co-flowing fabrication process for the electroactive device. The flexible substrate may include, but not be limited to, paper, paperboard, plastic film (e.g., polyester film, polypropylene film, aluminum foil, woven fabric, etc.).

In some embodiments, the abutting materials (e.g., the first electrode material 510, the second electrode material 520, and others such materials) may include a conductive material. In additional embodiments, the conductive material may include metals such as aluminum, gold, silver, tin, copper, indium, gallium, zinc, and the like. Other conductive materials may be used, including carbon nanotubes, graphene, transparent conductive oxides (TCOs, such as indium tin oxide (ITO), zinc oxide (ZnO), etc.), and the like. In some configurations, it may be necessary for the abutting materials (e.g., the first electrode material 510, the second electrode material 520) to stretch elastically. In such embodiments, the abutting materials may include TCOs, graphene, carbon nanotubes, and the like.

In some embodiments, the first electrode material 510 and/or the second electrode material 520 may have a thickness of approximately 1 nm to approximately 500 nm, with an example thickness of approximately 10 nm to approximately 50 nm. Some of the abutting materials may be designed to allow healing of electrical breakdown (e.g., the electric breakdown of nanovoided polymer materials).

In some embodiments, the abutting materials may be fabricated using any suitable process. For example, the abutting materials may be fabricated using PVD, CVD, sputtering, spray-coating, spin-coating, atomic layer deposition (ALD), and the like. In another embodiment, the abutting materials may be manufactured using a thermal evaporator, a sputtering system, a spray coater, a spin-coater, an ALD unit, and the like.

In some embodiments, the abutting materials may be formed from a thin film of electrically conductive and semi-transparent material, such as ITO. In some implementations, alternatives to ITO may be used, including wider-spectrum TCOs, conductive polymers, metal grids, carbon nanotubes (CNT), graphene, nanowire meshes, and thin-metal films. Additional TCOs may include doped binary compounds, such as aluminum-doped zinc-oxide (AZO) and indium-doped cadmium-oxide. Additional TCOs may include barium stannate and metal oxides, such as strontium vanadate and calcium vanadate. In some implementations, conductive polymers may be used as the abutting materials. For example, a poly(3,4-ethylenedioxythiophene) PEDOT:poly(styrene sulfonate) PSS layer may be used. In another example, a poly(4,4-dioctyl cyclopentadithiophene) material doped with iodine or 2,3-dichloro-5,6-dicyano-1,4-benzoquinone (DDQ) may be used. The example polymers and similar materials may be spin-coated in some embodiments.

In an embodiment, the electroactive materials (e.g., first electroactive material 530, second electroactive material 537, and the like) may include nanovoided polymer materials. In another embodiment, the electroactive materials may include electroactive polymers and/or elastomer materials. In some examples, an "electroactive polymer" may refer to a deformable polymer that may be symmetric with respect to electrical charge (e.g., polydimethylsiloxane (PDMS) acrylates, and the like) or asymmetric (e.g., poled polyvinylidene fluoride (PVDF) or its copolymers such as poly[(vinylidenefluoride-co-trifluoroethylene] (PVDF-TrFE)).

In some embodiments, the nanovoided polymer materials may include thermoplastic polymers. Suitable polymers may include, but are not limited to, polyolefins, for example, polyethylene homopolymers and copolymers, polypropylene, polypropylene homopolymers and copolymers, functionalized polyolefins, polyesters, poly(ester-ether), polyamides, including nylons, poly(ether-amide), polyether sulfones, fluoropolymers, polyurethanes, and mixtures thereof. Polyethylene homopolymers include those of low, medium or high density and/or those formed by high-pressure or low-pressure polymerization. Polyethylene and polypropylene copolymers include, but are not limited to, copolymers with C4-C8 alpha-olefin monomers, including 1-octene, 1-butene, 1-hexene and 4-methyl pentene.

Other non-limiting examples of suitable olefinic polymeric compositions for use as the nanovoided polymer materials include olefinic block copolymers, olefinic random copolymers, polyurethanes, rubbers, vinyl arylenes and conjugated diener, polyesters, polyamides, polyethers, polyisoprenes, polyneoprenes, copolymers of any of the above, and mixtures thereof.

Examples of suitable copolymers for use as the nanovoided polymer materials include, but are not limited to, copolymers such as poly(ethylene-butene), poly(ethylene-hexene), poly(ethylene-octene), and poly(ethylene-propylene), poly(ethylene-vinylacetate), poly(ethylene-methylacrylate), poly(ethylene-acrylic acid), poly(ethylene-butylacrylate), poly(ethylene-propylenediene), poly(methyl methacrylate) and/or polyolefin terpolymers thereof.

In some aspects, the nanovoided polymer materials may include elastomeric polymers, including styrenic block copolymers, elastomeric olefinic block copolymers and combinations thereof. Non-limiting examples of suitable styrenic block copolymers (SBC's) include styrene-butadiene-styrene (SBS), styrene-isoprene-styrene (SIS), styrene-ethylene-butylene-styrene (SEBS), styrene-ethylene-propylene (SEP), styrene-ethylene-propylene-styrene (SEPS), or styrene-ethylene-ethylene-propylene-styrene (SEEPS) block copolymer elastomers, polystyrene, and mixtures thereof. In one embodiment, the film includes styrene-butadiene-styrene, polystyrene, and mixtures thereof.

The nanovoided polymer materials may further include optional components, such as fillers, plasticizers, compatibilizers, draw down polymers, processing aids, anti-blocking agents, viscosity-reducing polymers, and the like. Other additives may include pigments, dyes, antioxidants, antistatic agents, slip agents, foaming agents, heat or light stabilizers, UV stabilizers, and the like.

As noted, in various embodiments, the electroactive materials may include elastomer materials. In some embodiments, an "elastomer material" may refer to a polymer with viscoelasticity (i.e., both viscosity and elasticity) and relatively weak intermolecular forces, and generally low elastic modulus (a measure of the stiffness of a solid material) and high failure strain compared with other materials. In some embodiments, the electroactive materials (e.g., first electroactive material 530, second electroactive material 537, and the like) may include nanovoided polymer materials; further, the nanovoided polymer materials may include an elastomer material that has an effective Poisson's ratio of less than a predetermined value (e.g., less than approximately 0.35, less than approximately 0.3, less than approximately 0.25, less than approximately 0.2, less than approximately 0.15, less than approximately 0.1, less than approximately 0.5). In at least one example, the elastomer material may have an effective density that is less than a predetermined value (e.g., less than approximately 90%, less than approximately 80%, less than approximately 70%, less than approximately 60%, less than approximately 50%, less than approximately 40%) of the elastomer when densified (e.g., when the elastomer is compressed, for example, by abutting materials to make the elastomer denser).

In some examples, the electroactive materials may include nanovoided polymer materials that may include a plurality of voids, including nano-sized voids. In some embodiments, the nanovoids may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the nanovoided polymer materials. The voids and/or nanovoids may be either closed- or open-celled, or a mixture thereof. If they are open-celled, the void size may be the minimum average diameter of the cell. In some embodiments, the polymer layer may have an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, approximately 9 GPa).

The voids and/or nanovoids may be any suitable size and, in some embodiments, the voids may approach the scale of the thickness of the polymer layer in the undeformed state. For example, the voids may be between approximately 10 nm to about equal to the gap between the paired two electrodes. In some embodiments, the voids may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, approximately 1000 nm).

In some examples, the term "effective density," as used herein, may refer to a parameter that may be obtained using a test method where a uniformly thick layer of a given electroactive material including a nanovoided polymer material (e.g., elastomer) may be placed between two flat and rigid circular plates. In some embodiments, the diameter of the nanovoided polymer material being compressed may be at least 100 times the thickness the nanovoided polymer material. The diameter of the nanovoided polymer material may be measured, then the plates may be pressed together to exert a pressure of at least approximately $1 \times 10^6$ Pa on the nanovoided polymer material, and the diameter of the nanovoided polymer material may be remeasured. The effective density may be determined from the following expression: $D_{ratio} = D_{uncompressed}/D_{compressed}$, where $D_{ratio}$ may represent the effective density ratio, $D_{uncompressed}$ may represent the density of the uncompressed nanovoided polymer material, and $D_{compressed}$ may represent the density of the uncompressed nanovoided polymer material.

In some embodiments, the electroactive materials (e.g., first electroactive material 530, second electroactive material 537, and the like) may include particles of a material having a high dielectric constant, the particles having an average diameter between approximately 10 nm and approximately 1000 nm. In some embodiments, the material having the high dielectric constant may include barium titanate $BaTiO_3$), which is a member of the perovskite family and which may also include other titanates. Additionally or alternatively, any other suitable component may be added to the electroactive polymer material. $BaTiO_3$ is a ferroelectric material with a relatively high dielectric constant (e.g., a value of between approximately 500 and approximately 7000) and polarization and may be used in various electroactive devices described herein. Besides large polarizability and permittivity, large strains may also be achievable with $BaTiO_3$. Pure $BaTiO_3$ is an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the electroactive polymer materials, including nanovoided polymer materials.

In some embodiments, the electroactive materials (e.g., first electroactive material 530, second electroactive material 537, and the like) may include nanovoided polymer materials that may have a thickness of from approximately 10 nm to approximately 10 μm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 μm, approximately 2 μm, approximately 3 μm, approximately 4 μm, approximately 5 μm, approximately 6 μm, approximately 7 μm, approximately 8 μm, approximately 9 μm, approximately 10 μm), with an example thickness of approximately 200 nm to approximately 500 nm.

In some embodiments, the electroactive materials (e.g., first electroactive material 530, second electroactive material 537, and the like) may include a first elastomer material and a second elastomer material, respectively, each having a Poisson's ratio of approximately 0.35 or less. In some embodiments, the electroactive materials (e.g., first electroactive material 530, second electroactive material 537, and the like) may include particles of a material to assist the formation or to support the voided regions, or both. Suitable particles include a silicate, such as silica, including structures resulting from silica gels, fumed silica, a titanate, such as barium titanate, a metal oxide, such as titanium dioxide, composites thereof, and the like. The particles may have an average diameter between approximately 10 nm and approximately 1000 nm, and the particles may form branched or networked particles with average dimensions of between approximately 100 and approximately 10,000 nm.

As noted, the nanovoided materials may also include a surfactant. In some embodiments, the surfactant may provide improved compatibility between the polymer and monomer, or between the polymer and the solvent. Alternatively, or in addition, the surfactant may reduce the surface energy of the nanovoids, which can reduce adhesive forces when the nanovoids are compressed.

Figure 6:
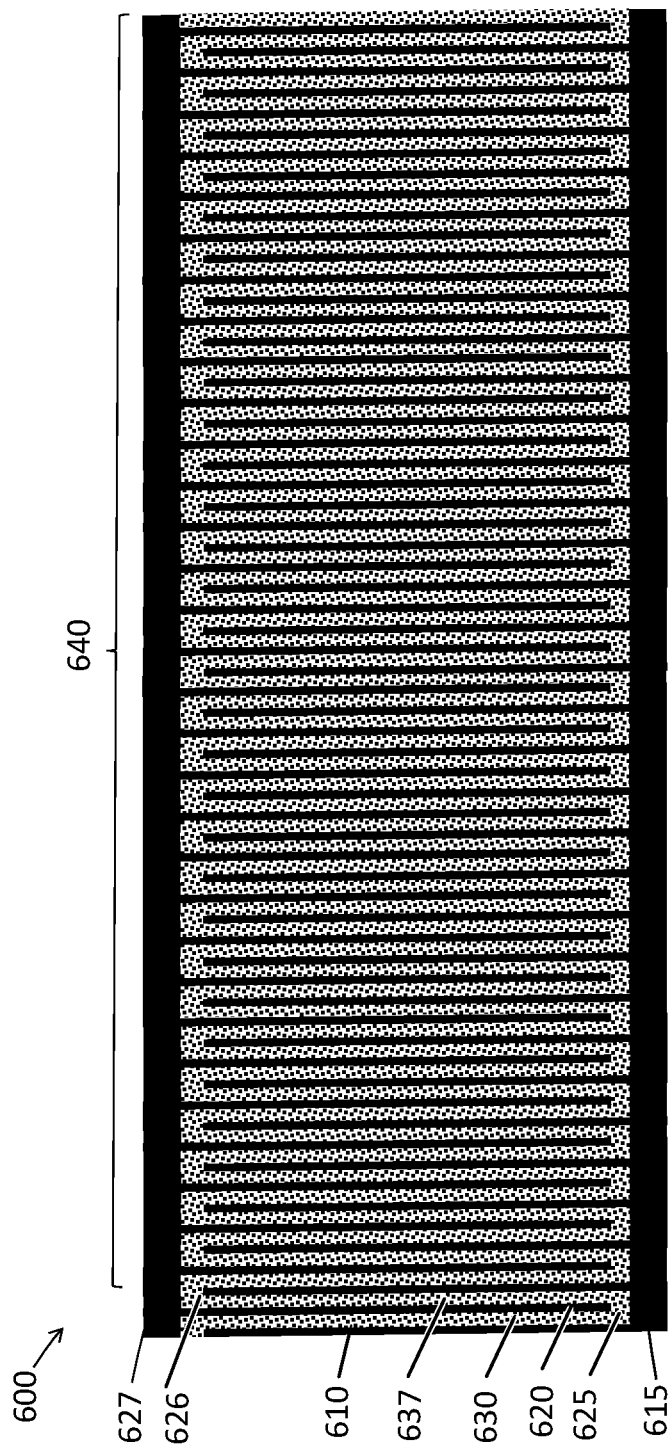
FIG. 6 shows an example cross-sectional view of another electroactive device, in accordance with example embodiments of the disclosure.

FIG. 6 shows a cross-sectional view of another electroactive device 600, in accordance with example embodiments of the disclosure. The electroactive device 600 shown in this figure may, for example, be an actuator and/or any other suitable electroactive device. In an embodiment, the electroactive device 600 may include a substrate (not shown, but which may include a rigid substrate such as glass, sapphire and the like, or a flexible substrate such as paper, metal foil, plastic, and the like). The substrate may be similar, but not necessarily identical to, the substrate described in connection with FIG. 5, above. In another embodiment, the substrate may be positioned at the bottom of the electroactive device.

In an embodiment, the electroactive device 600 may include a first electrode material 610, which may be alternatively referred to as a first electrode herein. The first electrode material 610 may include an electrically conductive material and may serve as an electrode for the electroactive device 600. In an embodiment, the electroactive device 600 may optionally include a common bus 615. In an embodiment, the common bus 615 may include a portion of the first electrode material 610 (e.g., a portion of the electronic conducting material serving as an electrode).

In an embodiment, the electroactive device 600 may include a first electroactive material 630, such as a first nanovoided polymer material, as described in connection with FIG. 5. In another embodiment, the electroactive device 600 may include a first insulating area 625, and in some examples, the first insulating area 625 may include a portion of the first nanovoided polymer material. In an embodiment, the electroactive device 600 may include a contact area 627. The contact area 627 may be similar to the common bus 615 and may be optional. The contact area 627 may allow for a connection (e.g., an electrical connection), to a second electrode material 620, which may be referred to as a second electrode herein. The second electrode material 620 may include an electrically conductive material that may serve as an electrode. In an embodiment, the electroactive device 600 may include a second insulating area 626. The second insulating area 626 may include a portion of a second electroactive material 637, such as a second nanovoided polymer material.

In certain embodiments, the electroactive device 600 may further include one or more additional electroactive material layers (e.g., electroactive material 630 and/or 637) and/or abutting material layers (e.g., electrodes including first electrode material 610 and/or second electrode material 620) overlapping in a stacked configuration having from three electroactive material layers and corresponding electrodes to thousands of electroactive material layers.

In various embodiments, the electroactive material layers and/or abutting material layers of electroactive device 600 may be similar, but not necessarily identical to, corresponding layers described in connection with FIG. 5, above.

Figure 7:
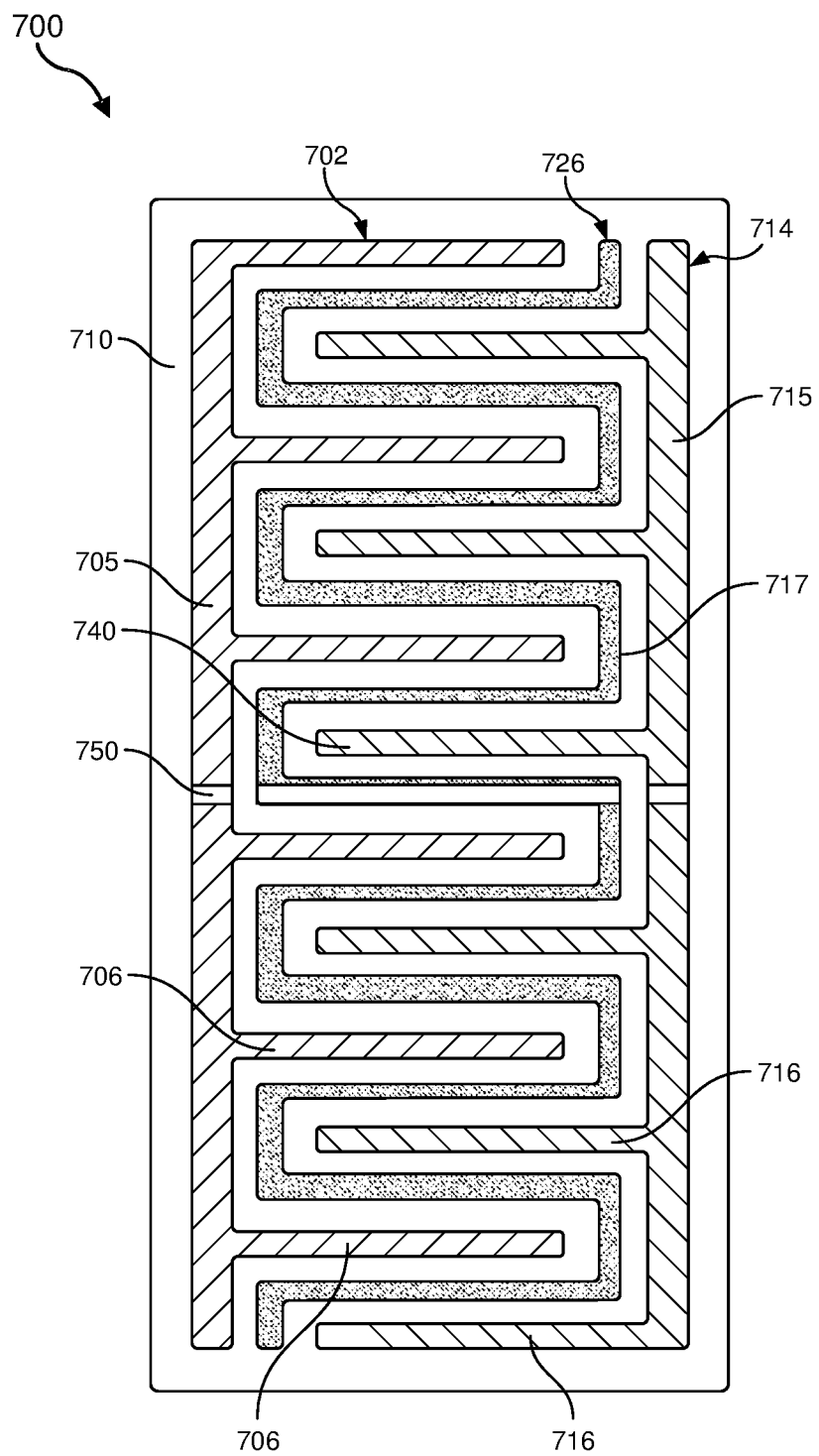
FIG. 7 shows an example cross-sectional view of an extrusion apparatus including a manifold extrusion die, in accordance with example embodiments of the disclosure.

FIG. 7 shows a diagram 700 illustrating an extrusion apparatus including a manifold extrusion die 700, in accordance with example embodiments of the disclosure. The manifold extrusion die 700, which may have a die structure 710, may include a first manifold inlet opening 702 and a second manifold inlet opening 714 configured to flow at least one electrode precursor material into the manifold extrusion die 700. In another embodiment, the manifold extrusion die 700 may include a third manifold inlet opening 726 configured to flow an electroactive polymer precursor material into the manifold extrusion die 700 such that the electroactive polymer precursor material may be layered between alternating layers of the electrode precursor material from the first manifold inlet opening 702 and second manifold inlet opening 714. Further, the manifold extrusion die 700 may include a manifold outlet opening 750 (see, e.g., manifold outlet opening 850 shown in FIG. 8) configured to deposit multiple stacked layers of the electrode precursor material and the electroactive polymer precursor material onto a substrate.

In one embodiment, the first manifold inlet opening 702 may include a first side region 705 and first parallel protruding regions 706 that overlap and are connected to the first side region 705. Additionally, the second manifold inlet opening 714 may include a second side region 715 and second parallel protruding regions 716 that overlap and are connected to the second side region 715. In another embodiment, the third manifold inlet opening 726 may include interconnected protruding regions 717 that overlap and are sandwiched between the first parallel protruding regions 706 and the second parallel protruding regions 716.

In various embodiments, the manifold extrusion die 700 may also include a substrate conveyance system (not shown, but similar and not necessarily identical to, the apparatus shown and described in connection with FIGS. 4A and 4B, above), which may move the substrate with respect to the manifold outlet opening 750.

Figure 8:
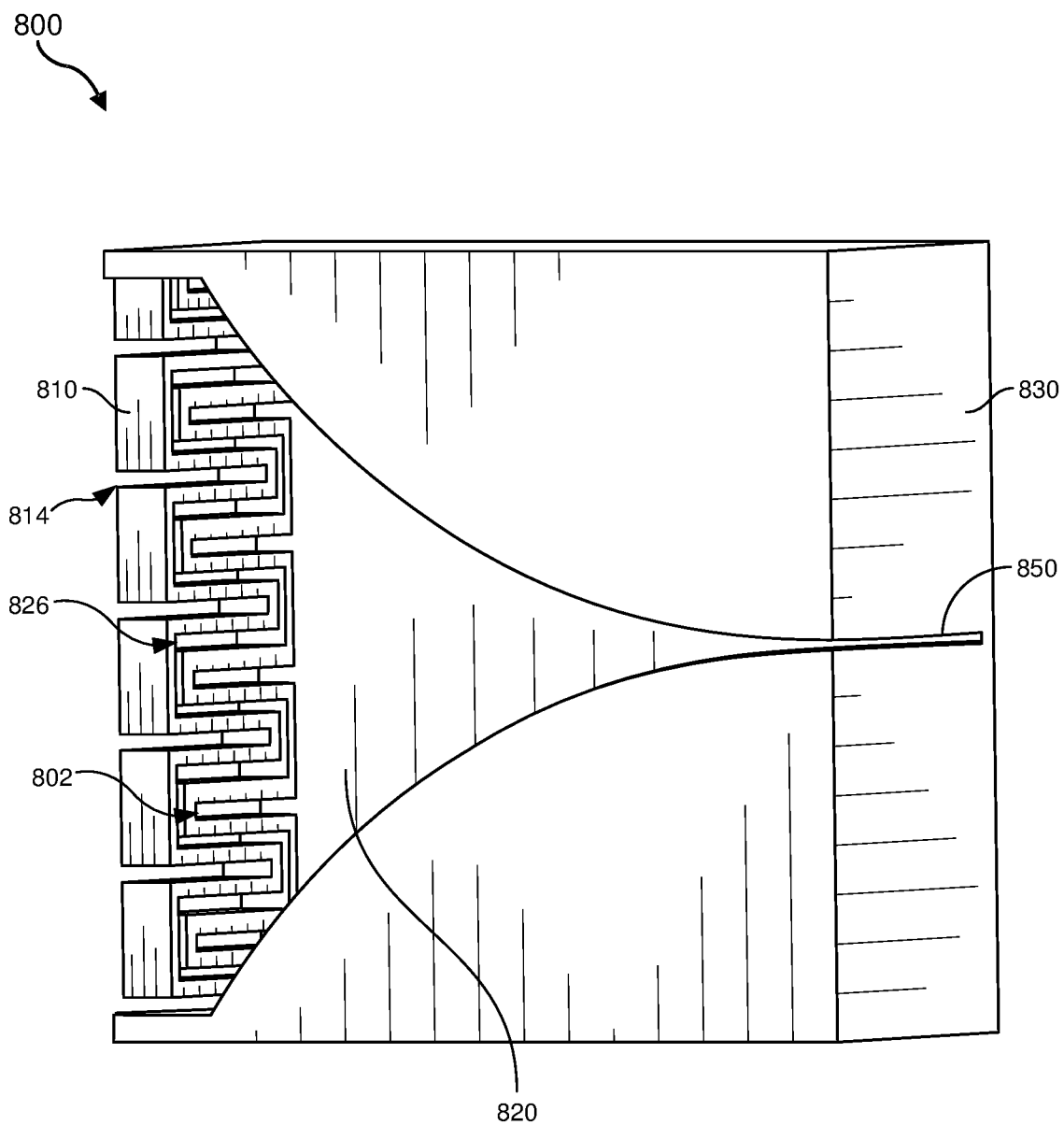
FIG. 8 shows an alternative cross-sectional view of the manifold extrusion die, in accordance with example embodiments of the disclosure.

FIG. 8 shows an alternative cross-sectional view 800 of a manifold extrusion die 830, in accordance with example embodiments of the disclosure. In particular, the manifold extrusion die 830 includes die structure 810, which may be similar to the die structure 710 shown and described in connection with FIG. 7 above. Additionally, manifold extrusion die 830 may include a first manifold inlet opening 802, a second manifold inlet opening 814, and third manifold inlet opening 826 (see, e.g., first manifold inlet opening 702, second manifold inlet opening 714, and third manifold inlet opening 726 illustrated in FIG. 7). Further, the manifold extrusion die 830 shows an interior wall 820 of the manifold extrusion die 810, the manifold extrusion die 830, and the manifold outlet opening 850. In various embodiments, the manifold extrusion die 830 may serve to orient and guide the flow of a multilayer precursor mixture (e.g., mixture 230 and first and second abutting materials 220 and 235 shown and described in connection with FIG. 2, above) from a manifold outlet opening 850 to a thin, flat planar flow. Further, the manifold extrusion die 830 may be configured to ensure constant, uniform flow across the cross-sectional area of the die. Accordingly, materials for forming multiple electroactive material layers and multiple electrode layers may be simultaneously flowed into and through manifold extrusion die 830 to form a multi-layer stacked structure of an electroactive device (see, e.g., FIGS. 5 and 6).

Figure 9:
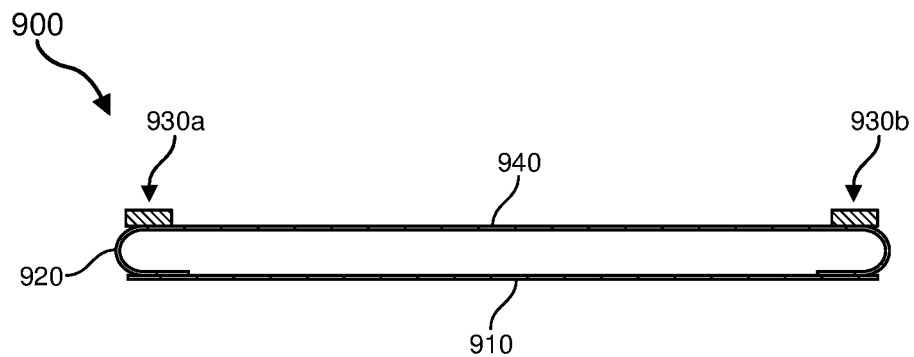
FIG. 9 shows a diagram of a cross-sectional view of an example deformable element and a lens assembly which may include one or more electroactive devices described herein, in accordance with example embodiments of the disclosure.

FIG. 9 shows a diagram of a cross-sectional view of an example deformable element and a lens assembly which may include one or more electroactive devices described herein, in accordance with embodiments of the disclosure. As shown in FIG. 9, adjustable lens 900 may be an adjustable lens with a structural support element 910 (e.g., a rigid backplane) and a deformable optical element 940, with a seal 920 formed between the structural support element 910 and the deformable optical element 940. In various embodiments, the adjustable lens may include any suitable type of lens with adjustable optical properties (e.g., adjustable optical power/focal length, correcting for wavefront distortion and/or aberrations, etc.). In some examples, as will be explained in greater detail below, an adjustable lens may include a liquid lens. For example, adjustable lens 900 may be filled with an optical medium that is at least partially encapsulated by a deformable optical element (i.e., between structural support element 910 and deformable optical element 940). For example, lens 900 may be filled with a liquid or a semi-solid material (e.g., a gel, a semi-solid polymer, etc.). In general, lens 900 may contain a substantially transparent material that deforms and/or flows under pressure.

Structural support element 910 and deformable optical element 940 may be composed of any suitable materials. In some examples, structural support element 910 may include a rigid material. For example, structural support element 910 may be composed of a rigid, substantially transparent polymer. Deformable optical element 940 may include a substantially transparent and elastic material. For example, deformable optical element 940 may be composed of a natural or synthetic elastomer that returns to a resting state when a deforming force is removed. As will be explained in greater detail below, in some examples deformable optical element 940 may be deformed using an electroactive device (e.g., actuator) generating a directly-driven force to produce a desired optical power or other optical property for lens 900. In various embodiments, the electroactive device may be similar to the electroactive devices described in connection with FIGS. 5 and 6, above and fabricated, for example, using one or more aspects of the methods shown and described in connection with FIGS. 1-4, above.

Although the lens 900 is unactuated in FIG. 9, forces may be applied by electroactive device(s) to lens 900 to actuate the lens 900 (as will be described in connection with FIG. 9). Further, such forces may be uniform around a perimeter of lens 900 or may be variable around the perimeter of lens 900. For example, a vector (not shown) corresponding to a force applied by mechanical action of a first electroactive device (e.g., a first actuator) 930a may be the same as a vector corresponding to a force applied by mechanical action of a second electroactive device (e.g., a second actuator) 930b. Alternatively, a vector corresponding to a force applied by mechanical action of a first electroactive device 930a may be different from a vector corresponding to a force applied by mechanical action of a second electroactive device 930b.

Figure 10:
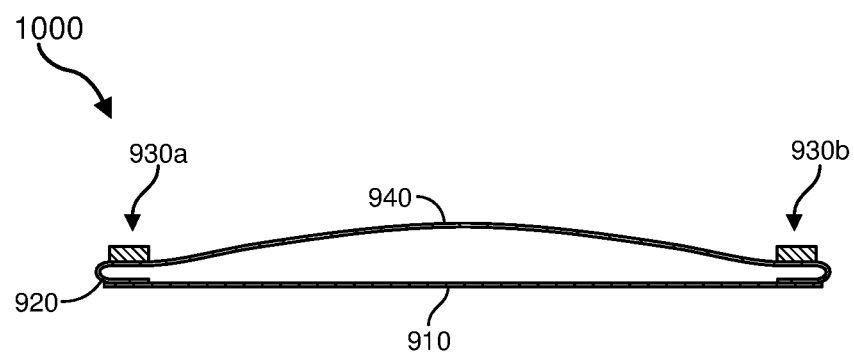
FIG. 10 shows a diagram of a cross-sectional view of the example deformable element and a lens assembly of FIG. 9 in an actuated state, in accordance with embodiments of the disclosure.

FIG. 10 shows a diagram of a cross-sectional view of the example deformable element and a lens assembly of FIG. 9 in an actuated state, in accordance with embodiments of the disclosure. In particular, FIG. 10 depicts adjustable lens 1000 being actuated by receiving force applied by mechanical action of two different electroactive devices. In this example, first electroactive device 930a may apply a pushing force (not shown) having a vector of a first magnitude and first direction to a first area on the perimeter of lens 1000. Second electroactive device 930b may apply a pushing force (not shown) having vector of a second magnitude and second direction to a second area on the perimeter of lens 900 to achieve a desired optical power or other optical property for the lens 900. Those skilled in the art will understand that other embodiments may use various combinations of compression and distension, with various numbers of actuators applying varying forces to various locations on a deformable optical element to achieve desired optical properties for the lens.

The forces applied by the electroactive device in FIG. 10 to actuate the lens 1000, as well as any other suitable forces, may be applied by any suitable type electroactive device, such as that shown and described in connection with FIGS. 6 and 7 of the disclosure. In another embodiment, at least one of the electroactive devices (e.g., one of the electroactive devices 930a and 930b) may include a direct-drive actuator. As used in some embodiments, the term "direct-drive actuator" may refer to an actuator used in a direct-drive system or configuration (e.g., any configuration that does not involve an intermediate, off-axis device to transmit power). In contrast, indirect-drive systems may have at least one drive-train component (e.g., a belt, a chain, a ball-screw mechanism, a gear, etc.) that is not connected along the same axis of movement as the actuator. Examples of direct-drive actuators may include, without limitation, electrically driven actuators, electroactive benders, voice coil actuators, shape memory alloys, hydraulic pumps, etc.

As noted, in various embodiments, a direct-drive actuator may include a bender. In some examples, the term "bender," as used herein, may refer, without limitation, to an electrically-driven actuator based on a plate or beam design that converts in-plane contraction, via an applied electric field, into out-of-plane displacement. A bender or bending actuator may include an all-electroactive or composite material stack operated in a bimorph, unimorph, or multilayered monolith configuration. In some embodiments, the term "unimorph bender," as used herein, may refer, without limitation, to a beam or plate having an electroactive layer and an inactive layer, in which displacement results from contraction or expansion of the electroactive layer. In some embodiments, the term "bimorph bender," as used herein, may refer, without limitation, to a beam or plate having two electroactive layers, in which displacement results from expansion or contraction of one layer with alternate contraction or expansion of the second layer.

In some embodiments, the term "multilayer bender," as used herein, may refer, without limitation, to a multilayer stack of electroactive, electrode, and insulation layers integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some examples, a control system for a multilayer bender may not require a high voltage power supply.

According to some embodiments, an actuator may be a frame-contoured ring bender and/or may include stacked or overlapping benders. Furthermore, actuator volume may be constrained to an edge region outside an optical aperture, which may include a perimeter volume of a lens, an optical element, an optical sub-assembly, etc. As noted, electroactive device(s) such as an actuator (or a set of actuators) may provide equal or varied force and displacement at discrete points or along a spatially-defined distribution at the perimeter of a lens.

The electroactive device including direct-drive benders disclosed herein may include a polymer material (e.g., a nanovoided polymer material) that is disposed between two abutting materials (e.g., electrodes). In such examples, methods of forming an electroactive device may involve forming electrodes and a nanovoided polymer material simultaneously (e.g., via co-flowing, slot die coating, curtain coating, etc.), as variously described herein.

Figure 11:
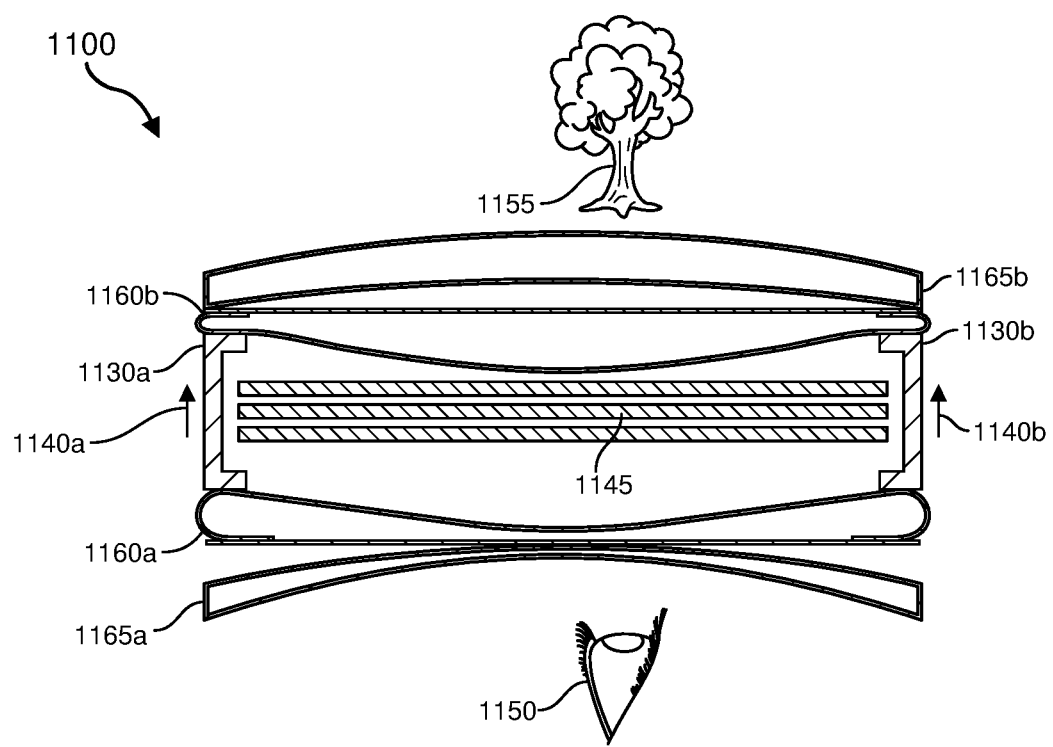
FIG. 11 shows a diagram of an example cross-sectional view of a lens assembly device with multiple deformable elements (e.g., multiple liquid lenses) including electroactive devices, in accordance with example embodiments of the disclosure.

FIG. 11 shows a diagram of an example cross-sectional view of a lens assembly device with multiple deformable elements (e.g., multiple liquid lenses) including electroactive devices, in accordance with some embodiments of the disclosure. In particular, FIG. 11 shows a side view of a lens-display assembly 1100. As shown in FIG. 11, lens-display assembly 1100 may include an adjustable-focus lens 1160a and an adjustable-focus lens 1160b. In addition, lens-display assembly 1100 may include a carriage 1130a and a carriage 1130b, each of which connect adjustable-focus lens 1160a to adjustable-focus lens 1160b (e.g., via respective electroactive devices).

Because carriages 1130a and 1130b are connected to electroactive devices (e.g., direct-drive actuators) coupled to both adjustable-focus lens 1160a and adjustable-focus lens 1160b, when carriage 1130a and/or 1130b moves, carriage 1130a and/or 1130b may apply forces to adjustable-focus lens 1160a and adjustable focus lens 1160b simultaneously, thereby deforming and modifying the optical power of adjustable-focus lenses 1160a and 1160b.

In addition, in some examples, lens-display assembly 1100 may include a display 1145 situated between adjustable-focus lenses 1160a and 1160b. For example, display 1145 may include an augmented-reality display that is substantially translucent (except for, e.g., virtual objects displayed by display 1145), allowing a user's eye 1150 to see beyond display 1145 to real-world objects such as a tree 1155 illustrated in FIG. 11.

In some embodiments, carriages 1130a and 1130b may each apply equal pressure to adjustable-focus lens 1160a and adjustable focus lens 1160b (e.g., pressure sufficient to maintain tension within the respective membranes of adjustable-focus lenses 1160a and 1160b but not to deform adjustable-focus lenses 1160a and 1160b). Accordingly, adjustable-focus lenses 1160a and 1160b may be flat and exhibit no substantial optical power. Thus, the apparent accommodation distance of a virtual object displayed by display 1145 may be the actual distance of display 1145 from the user's eye 1150. Likewise, lens-display assembly 1100 may not significantly change the appearance of tree 1155 to the user's eye 1150.

In some examples, one or more of the carriages described herein may be rigid. Additionally or alternatively, one or more of the carriages described herein may have a degree of elasticity in one or more directions. In some examples, the length of the carriages may be fixed. In some examples, the length of the carriages may be adjustable. For example, the length of a carriage may be manually adjustable by using, e.g., a set screw or an adjustable threaded shaft. Additionally or alternatively, the length of the carriage may be dynamically adjustable through the use of, for example, a piezoelectric stack.

FIG. 11 depicts lens-display assembly 1100 in an adjusted state. As shown in FIG. 11, carriages 1130a and 1130b may be actuated by one or more actuators (e.g., electroactive devices as described herein) to move away from the user's eye 1150 and adjustable-focus lens 1160a, and toward adjustable-focus lens 1160b. In the process, forces 1140a and 1140b applied by carriages 1130a and 1130b, respectively, may shape adjustable-focus lens 1160a into a plano-concave lens, and shape adjustable-focus lens 1160b into a plano-convex lens. Adjustable-focus lens 1160a may thereby cause an image displayed by display 1145 to appear closer to eye 1150. At the same time, adjustable-focus lens 1160b may compensate for the optical power created by adjustable-focus lens 1160a so that the appearance of tree 1155 is not significantly affected by the change to adjustable-focus lens 1160a.

As should be appreciated, in some examples intermediate positions of carriages 1130a and 1130b may result in intermediate changes to the apparent accommodation distance of images displayed by display 1145, allowing for a continuous range of possible apparent accommodation distances for virtual objects while maintaining the fidelity of the appearance of real-world objects.

In some embodiments, additional optical elements such as lens 1165a and lens 1165b may be included to provide additional optical power. In some embodiments, the lenses 1165a and 1165b may include prescription lenses that may be used to treat refractive errors of the eye, which may include, for example, myopia, hypermetropia, astigmatism, and presbyopia, and the like. In other embodiments, the prescription lenses may be customized to correct for a given user's refractive errors, which may include various components, such as a sphere component to address myopia and/or presbyopia, a cylinder component to address astigmatism, and a prism component to address strabismus and other binocular vision disorders.

Figure 12:
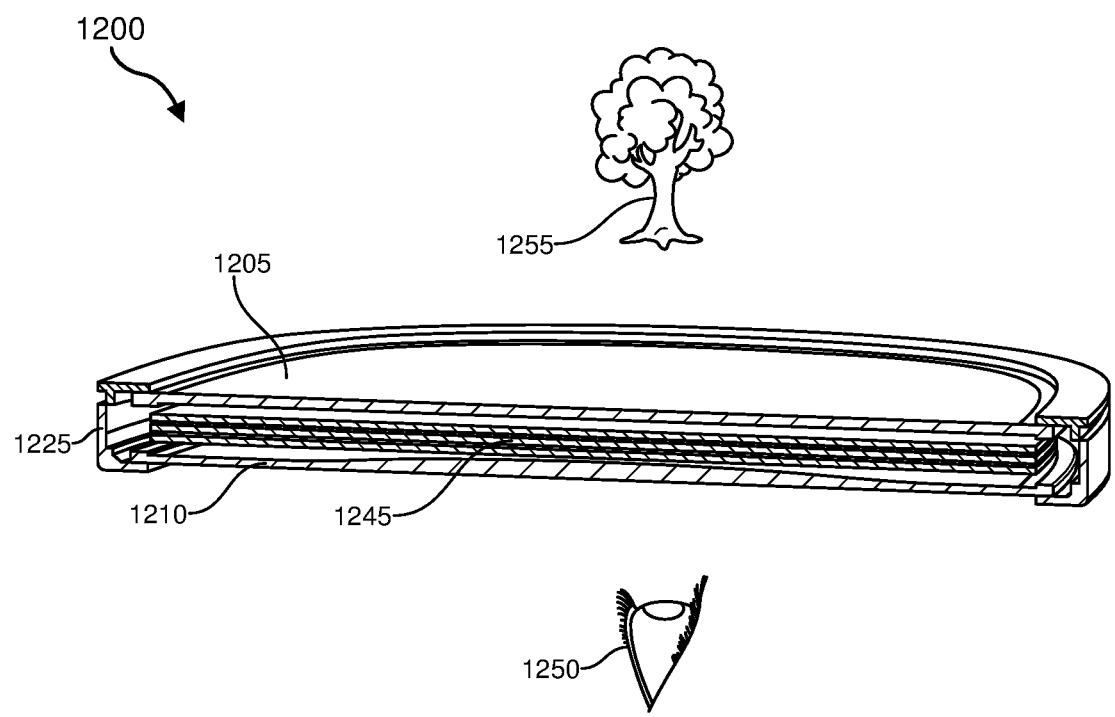
FIG. 12 shows a cross-section of a lens-display assembly, in accordance with at least one embodiment.

FIG. 12 illustrates a cross-section of a lens-display assembly 1200, in accordance with at least one embodiment. As shown in FIG. 12, lens-display assembly 1200 may include an adjustable lens 1205, an adjustable lens 1210, a display 1245 positioned between adjustable lenses 1205 and 1210, and a lens assembly housing 1225. In some examples, the volume between lens assembly housing 1225 and display 1245 may provide space for electroactive devices (e.g., direct drive actuators) as described herein. According to some examples, the combination of adjustable lenses 1205 and 1210 may modify the apparent accommodation distance of images created by display 1245 without changing the appearance of distant real-world objects (e.g., tree 1255) as perceived by a user's eye 1250.

FIG. 13 shows a diagram of an example head mounted device (HMD), in accordance with example embodiments of the disclosure. In particular, the HMD may include the glasses 1300, which may include augmented reality glasses. As shown, glasses 1300 may include adjustable-focus lenses 1310 coupled to a frame 1330 (e.g., at an eyewire, not shown). In an embodiment, each of lenses 1310 may include, for example, an optical fluid encapsulated by an elastomeric membrane and an optically clear and rigid back substrate. Actuation along the perimeter of lenses 1310 (e.g., using one or more electroactive devices as further shown and described in connection with FIGS. 5 and 6 and fabricated, for example, using the methods shown and described in connection with FIGS. 1-4, and FIGS. 7-8, above) may change the curvature (and thus the optical power) of the lenses, with positive and negative shapes determined by the direction of the applied force. In an embodiment, a membrane surface may be non-planar (e.g., concave or convex) at rest (e.g., at zero electrical power). In one example, a membrane surface may be non-planar when a substrate is curved.

Electroactive devices (e.g., actuators) mounted in frame 1330 (e.g., in an eyewire) may deform each lens, with high optical quality achieved through tailored displacement and deflection, and via perimeter mounting for an asymmetric clear aperture including, for example, an RGB (red-green-blue) waveguide.

A control system (not shown) may trigger electroactive devices to adjust lenses (e.g., lenses 1310) to help address the vergence-accommodation conflict. The vergence-accommodation conflict may result from how humans perceive depth. When a human eye fixates on an object, it accommodates to that object—that is, it changes focal distance to bring that object into focus. That accommodation may serve as a visual cue to depth: objects that are much closer or further away than that distance may be out of focus on the retina. This "retinal blur" may serve as a cue that objects are at a different distance than the accommodative distance, although the cue is ambiguous as to whether the objects are closer or more distant.

When both eyes are used (stereoscopically), binocular disparity may serve as the main visual cue for depth. The two eyes look at an object from slightly different angles, so each eye may get slightly different views of the object. This difference in views may be the binocular disparity (imperfect match) between the two views. The visual system normally fuses these two images into a single perception and converts the disparity between the two images into a perception of depth. The closer an object is, the larger the disparity (error in matching) between the images produced on the two retinas.

In a typical virtual reality head-mounted device, a virtual display plane, or focal plane, may be located at a fixed distance. But virtual objects may be "located" either in front of or behind the focal plane. The head-mounted display may try to reproduce binocular disparity for such virtual objects, which is the main visual cue for depth. But the binocular disparity cue may drive the eyes to verge at one distance, while the light rays coming from the virtual plane may produce retinal blur that drives the eyes to accommodate to another distance, creating a conflict between those depth cues and forcing the viewer's brain to unnaturally adapt to conflicting cues. This vergence-accommodation conflict in turn creates visual fatigue, especially during prolonged use of an augmented reality system.

FIG. 14 shows a flow diagram illustrating an example method 1400 for fabricating electroactive devices, in accordance with example embodiments of the disclosure. At step 1402 in FIG. 14, an electrode precursor material may be flowed into a manifold extrusion die via first and second manifold inlet openings. In one embodiment, the first manifold inlet opening may have a first side region and first parallel protruding regions that overlap and are connected to the first side region (e.g., first side region 705 and first parallel protruding regions 706 of first manifold inlet opening 702), as shown and described, for example, in connection with FIG. 7 above. In some embodiments, the second manifold inlet opening may have a second side region and second parallel protruding regions that overlap and are connected to the second side region (e.g., second side region 715 and second parallel protruding regions 716 of second manifold inlet opening 714) as shown and described, for example, in connection with FIG. 7 above.

At step 1404 in FIG. 14, an electroactive polymer precursor material may be flowed into the manifold extrusion die via a third manifold inlet opening such that the electroactive polymer precursor material may be layered between alternating layers of the electrode precursor material from the first and second manifold inlet openings. In one embodiment, the third manifold inlet opening may have interconnected protruding regions (e.g., interconnected protruding regions 717 of third manifold inlet opening 726) that overlap and are sandwiched between the first parallel protruding regions and the second parallel protruding regions as shown and described, for example, in connection with FIG. 7 above. In one embodiment, the electroactive polymer precursor material may be combined with at least one non-curable component to form a mixture. In another embodiment, the electroactive polymer precursor material may be combined with particles of a material having a high dielectric constant.

At step 1406 in FIG. 14, the electrode precursor material and the electroactive polymer precursor material may be extruded through a manifold outlet opening of the manifold extrusion die. In one embodiment, the layered electroactive polymer precursor material and electrode precursor material may be flowed along an internal flow path (e.g., cavity 312 of FIG. 3) extending to the manifold outlet opening (e.g., exit 340 in FIG. 3). In another embodiment, a laminar flow of the layered electroactive polymer precursor material and electrode precursor material may be maintained along the internal flow path. In various embodiments, two or more of steps 1402, 1404, and/or 1406 of method 1400 may be carried out simultaneously and/or in parallel. For example, the electrode precursor material and the electroactive polymer precursor material may be coextruded through the manifold extrusion die as the electrode precursor material is flowed into the manifold extrusion die via the first and second manifold inlet openings (step 1402) while the electroactive polymer precursor material is flowed into the manifold extrusion die via the third manifold inlet opening (step 1404). In some examples, the electrode precursor material and the electroactive polymer precursor material may be extruded through the manifold outlet opening (step 1406) during such coextrusion of the electrode precursor material and the electroactive polymer precursor material (steps 1402 and 1404).

In various aspects, the deposited materials may be processed as described herein in order to form an electroactive device such as an actuator. In some embodiments, the electrode precursor material may be cured to form an electrically conductive material. Further, the deposited electroactive polymer precursor material may be cured to form an electroactive polymer element including a cured elastomer material. In one embodiment, the cured elastomer material may include at least one non-polymeric component in a plurality of defined regions. Further at least a portion of the at least one non-polymeric component may be removed from the cured elastomer material to form a nanovoided polymer material. In another embodiment, the cured elastomer material may have a Poisson ratio of approximately 0.35 or less.

As discussed throughout the instant disclosure, the disclosed devices, materials, systems, and methods may provide one or more advantages over conventional devices, materials, systems, and methods. For example, in contrast to prior devices, electroactive devices presented herein may include electroactive polymer elements that achieve substantially uniform strain in the presence of an electrostatic field produced by a potential difference between paired electrodes, permitting the electroactive devices to achieve, for example, improvements in both energy density and specific power density. Such uniform strain may reduce or eliminate unwanted deformations in the electroactive polymer elements and may result in greater overall deformation, such as compression, of the electroactive polymer elements, providing a greater degree of movement of surface regions of the electroactive polymer elements while requiring a lower amount of energy to provide such deformation. The electroactive polymer elements may include polymer materials having nanovoided regions that allow for additional compression in the presence of a voltage gradient in comparison to non-voided materials. Additionally, an electroactive device may be formed in a stacked structure having a plurality of electroactive polymer elements that are layered with multiple electrodes, enabling the plurality of electroactive polymer elements to be actuated in conjunction with each other in a single device that may undergo a more substantial degree of deformation (e.g., compression and/or expansion) in comparison to an electroactive device having a single electroactive polymer element or layer.

Electroactive devices described and shown herein may be utilized in any suitable technologies, without limitation. For example, such electroactive devices may be utilized as mechanical actuators to actuate movement of adjacent components. In at least one embodiment, the disclosed electroactive devices may be incorporated into optical systems such as adjustable lenses (e.g., fluid-filled lenses) to actuate movement of one or more optical layers. Such actuation may, for example, allow for selected movement of lens layers of an adjustable lens, resulting in deformation of the lens layers to adjust optical characteristics (e.g., focal point, spherical correction, cylindrical correction, axial correction, etc.) of the adjustable lens. In some embodiments, electroactive devices as disclosed herein may be utilized as actuators in micromechanical apparatuses, such as microelectromechanical devices. Additionally or alternatively, electroactive devices may be used for converting mechanical energy to electrical energy for use in energy harvesting systems and/or sensor devices.

Embodiments of the instant disclosure may include or be implemented in conjunction with an artificial reality system. Artificial reality is a form of reality that has been adjusted in some manner before presentation to a user, which, as noted, may include, e.g., a VR, an AR, a MR, a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a HMD connected to a host computer system, a standalone HMD, a mobile device or computing system, or any other hardware platform capable of providing artificial reality content to one or more viewers.

The process parameters and sequence of the steps described and/or illustrated herein are given by way of example only and may be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A manifold extrusion die comprising:
a first manifold inlet opening and a second manifold inlet opening configured to flow an electrode precursor material into the manifold extrusion die;
a third manifold inlet opening configured to flow an electroactive polymer precursor material into the manifold extrusion die such that the electroactive polymer precursor material is layered between alternating layers of the electrode precursor material from the first and second manifold inlet openings; and
a manifold outlet opening configured to deposit the electrode precursor material and the electroactive polymer precursor material, wherein
the first manifold inlet opening comprises a first side region and first parallel protruding regions that overlap and are connected to the first side region; and
the second manifold inlet opening comprises a second side region and second parallel protruding regions that overlap and are connected to the second side region.

2. The manifold extrusion die of claim 1, wherein the third manifold inlet opening comprises interconnected protruding regions that overlap and are sandwiched between the first parallel protruding regions and the second parallel protruding regions.

3. An extrusion apparatus comprising:
a manifold extrusion die comprising:
a first manifold inlet opening and a second manifold inlet opening configured to flow an electrode precursor material into the manifold extrusion die;
a third manifold inlet opening configured to flow an electroactive polymer precursor material into the manifold extrusion die such that the electroactive polymer precursor material is layered between alternating layers of the electrode precursor material from the first and second manifold inlet openings; and
a manifold outlet opening configured to deposit the electrode precursor material and the electroactive polymer precursor material onto a substrate; and
a substrate conveyance system configured to move the substrate with respect to the manifold outlet opening, wherein
the first manifold inlet opening comprises a first side region and first parallel protruding regions that overlap and are connected to the first side region; and
the second manifold inlet opening comprises a second side region and second parallel protruding regions that overlap and are connected to the second side region.

4. The apparatus of claim 3, wherein the substrate conveyance system comprises a rotating surface configured to move the substrate.

5. The apparatus of claim 4, wherein the substrate conveyance system comprises a rotating drum including the rotating surface.

6. The apparatus of claim 3, wherein the apparatus further comprises at least one of a heat source or an actinic radiation source configured to:
cure the electrode precursor material to form an electrically conductive material; and
cure the deposited electroactive polymer precursor material to form an electroactive polymer element comprising a cured elastomer material.

7. The apparatus of claim 6, wherein
the cured elastomer material comprises at least one non-polymeric component in a plurality of defined regions; and
the apparatus is further configured to remove at least a portion of the at least one non-polymeric component from the cured elastomer material to form a nanovoided polymer material.

8. The apparatus of claim 3, wherein the apparatus is further configured to combine the electroactive polymer precursor material with at least one non-curable component to form a mixture.

* * * * *